(12) United States Patent
Kim et al.

(10) Patent No.: US 9,804,467 B2
(45) Date of Patent: Oct. 31, 2017

(54) LIGHT CONTROLLING APPARATUS AND METHOD OF FABRICATING THE SAME

(71) Applicant: LG Display Co., Ltd., Seoul (KR)

(72) Inventors: Kihan Kim, Gyeonggi-do (KR); Jiyoung Ahn, Gyeonggi-do (KR); Moonsun Lee, CHungcheongnam-do (KR); Pureum Kim, Incheon (KR); Seokwon Ji, Incheon (KR)

(73) Assignee: LG Display Co., Ltd., Seoul (KR)

( * ) Notice: Subject to any disclaimer, the term of this patent is extended or adjusted under 35 U.S.C. 154(b) by 85 days.

(21) Appl. No.: 14/837,090

(22) Filed: Aug. 27, 2015

(65) Prior Publication Data

US 2016/0154259 A1 Jun. 2, 2016

(30) Foreign Application Priority Data

Dec. 2, 2014 (KR) .......................... 10-2014-0170655
Jun. 19, 2015 (KR) .......................... 10-2015-0087803

(51) Int. Cl.
*G02F 1/137* (2006.01)
*H01L 27/32* (2006.01)
(Continued)

(52) U.S. Cl.
CPC ............ *G02F 1/137* (2013.01); *C09K 19/542* (2013.01); *G02F 1/1334* (2013.01); *G02F 1/13394* (2013.01); *G02F 1/133711* (2013.01); *G02F 1/134363* (2013.01); *H01L 27/3232* (2013.01); *H01L 27/3272* (2013.01); *H01L 51/5262* (2013.01); *C09K 2019/546* (2013.01); *G02F 1/133377* (2013.01); *G02F 2001/13756* (2013.01); *G02F 2001/13775* (2013.01); *G02F 2001/133726* (2013.01);
(Continued)

(58) Field of Classification Search
None
See application file for complete search history.

(56) References Cited

U.S. PATENT DOCUMENTS 5,473,450 A * 12/1995 Yamada ............ G02F 1/133377
349/84
5,673,092 A * 9/1997 Horie ................ G02F 1/133371
349/84

(Continued)

OTHER PUBLICATIONS

Extended European Search Report dated Feb. 23, 2016 issued by the European Patent Office in corresponding European Patent Application No. 15182513.0.

(Continued)

*Primary Examiner* — Lex Malsawma
(74) *Attorney, Agent, or Firm* — Morgan, Lewis & Bockius LLP

(57) ABSTRACT

Provided are a light controlling apparatus and a method of fabricating the same. The light controlling apparatus comprises: a first electrode unit and a second electrode unit facing each other; a liquid crystal unit between the first electrode unit and the second electrode unit, the liquid crystal unit including: a liquid crystal; a network having a first polymer polymerized from a first monomer having a similar shape as the liquid crystal and a second polymer polymerized from a second monomer having a shape different from the first monomer; and a wall having the first polymer and the second polymer.

28 Claims, 22 Drawing Sheets

(51) Int. Cl.
    *G02F 1/1334*     (2006.01)
    *G02F 1/1339*     (2006.01)
    *G02F 1/1337*     (2006.01)
    *G02F 1/1343*     (2006.01)
    *H01L 51/52*     (2006.01)
    *C09K 19/54*     (2006.01)
    *G02F 1/1333*     (2006.01)

(52) U.S. Cl.
    CPC ............ *G02F 2001/133742* (2013.01); *G02F 2201/44* (2013.01); *G02F 2202/023* (2013.01); *G02F 2202/04* (2013.01); *G02F 2203/01* (2013.01)

(56) References Cited

U.S. PATENT DOCUMENTS

| | | | |
|---|---|---|---|
| 5,726,728 A * | 3/1998 | Kondo | G02F 1/133377 349/122 |
| 5,750,213 A * | 5/1998 | Onishi | C09K 19/12 252/299.01 |
| 5,781,259 A * | 7/1998 | Shinomiya | G02F 1/133377 349/88 |
| 5,940,156 A * | 8/1999 | Nishiguchi | G02F 1/133377 349/155 |
| 5,978,064 A * | 11/1999 | Nishiguchi | G02F 1/133377 349/156 |
| 6,130,738 A * | 10/2000 | Hatano | G02F 1/133377 349/156 |
| 6,864,931 B1 * | 3/2005 | Kumar | G02B 3/0006 349/188 |
| 7,075,613 B2 * | 7/2006 | Kumar | G02F 1/13394 349/156 |
| 7,355,668 B2 * | 4/2008 | Kumar | G02F 1/13392 349/155 |
| 9,140,924 B2 * | 9/2015 | Chen | G02F 1/1334 |
| 2012/0038852 A1 * | 2/2012 | Jang | G02F 1/1334 349/86 |
| 2013/0250214 A1 | 9/2013 | Sugi et al. | |

OTHER PUBLICATIONS

Ji-Hoon Lee et al., "Flexible Ferroelectric Liquid Crystal Cell Stabilized by Column Spacer and Polymer Wall: Influence of Bending and Pressing on the Mechanical Stability", Japanese Journal of Applied Physics, 50:060204-1 to 060204-3 (2011).

* cited by examiner

LIGHT CONTROLLING APPARATUS AND METHOD OF FABRICATING THE SAME

CROSS-REFERENCE TO RELATED APPLICATIONS

This application claims the priority of Korean Patent Application No. 10-2014-0170655 filed on Dec. 2, 2014 and Korean Patent Application No. 10-2015-0087803 filed on Jun. 19, 2015, in the Korean Intellectual Property Office, the disclosures of which are incorporated herein by reference in their entireties.

BACKGROUND OF THE INVENTION

Field of the Invention

The present invention relates to a light controlling apparatus and a method of fabricating the same.

Description of the Related Art

In recent years, as the world entered the information age, the field of display devices for processing and displaying information has grown rapidly. Thus, various display devices have been developed and have drawn attention.

Specific examples of display devices include a Liquid Crystal Display (LCD) device, a Plasma Display Panel (PDP) device, a Field Emission Display (FED) device, and an Organic Light Emitting Diode (OLED). Such displays demonstrate excellent performance, such as thinning, weight lightening, and low power consumption. Thus, currently, application fields of the display device continue to increase. In particular, the display device has been used as a user interface in most electronic devices or mobile devices.

Further, in recent years, a transparent display device which enables a user to see an object or an image positioned on the opposite side through a display device has been actively studied.

The transparent display device has advantages in terms of space efficiency, interior decoration, and design. Further, the transparent display device can be applied to various fields. The transparent display device can resolve spatial and visual constraints of conventional electronic devices by realizing a display device capable of recognizing information, processing information, and displaying information in a transparent electronic device. The transparent display device can be used in a smart window, and the smart window can be applied to be used in a smart home or smart vehicle.

Particularly, an LCD may be realized as a transparent display device using an edge-type backlight, but a transparent display device using the LCD exhibits a very low transmittance ratio. Also, the transparent display device using the LCD has a disadvantage in that transparency is reduced by a polarizer used for realizing black and outside visibility is negatively affected as well.

Further, a transparent display device using an OLED has higher power consumption than the transparent display device using an LCD. Also, a transparent display device has difficulty in expressing true black, but does not have a problem with a contrast ratio in a dark environment. However, it has a disadvantage of reduction in a contrast ratio in a normal environment with light.

Therefore, in order to realize a transmissive mode and a light shielding mode, there has been suggested a method of using polymer dispersed liquid crystal (PDLC) or polymer networked liquid crystal (PNLC) formed into a single layer with a light controlling apparatus of the transparent display device using an OLED. The polymer dispersed liquid crystal (PDLC) or polymer networked liquid crystal (PNLC) formed into a single layer can be formed by mixing a monomer and a liquid crystal and irradiating ultraviolet (UV) rays to the mixture.

Particularly, the polymer dispersed liquid crystal (PDLC) has a structure in which a liquid crystal is formed within a polymer, and the polymer networked liquid crystal (PNLC) has a structure in which a polymer is distributed in a network structure on a liquid crystal.

If an electric field is applied to the polymer dispersed liquid crystal (PDLC) or polymer networked liquid crystal (PNLC), an alignment of the liquid crystal is changed, and, thus, light incident from the outside can be scattered or transmitted. That is, a device using the polymer dispersed liquid crystal (PDLC) or polymer networked liquid crystal (PNLC) can scatter or transmit light without a polarizer, and, thus, can be used as a light controlling apparatus of a transparent display device.

SUMMARY OF THE INVENTION

Accordingly, the present invention is directed to a light controlling apparatus and display device including the same, which substantially obviate one or more problems due to limitations and disadvantages of the related art.

An object of the present invention is to provide a light controlling apparatus and display device including the same, which may be reduced in power consumption by transmitting a light incident from the outside in an initial state where a voltage is not applied and thus realizing a transparent mode in the initial state.

Further, another object of the present invention is to provide a light controlling apparatus including both a network and a wall within a liquid crystal unit.

Furthermore, yet another object of the present invention is to provide a light controlling apparatus including a wall and a network each having two kinds of polymers using two or more different monomers.

Also, still another object of the present invention is to provide a light controlling apparatus that assists vertical alignment of a liquid crystal by using a monomer having a similar shape with the liquid crystal and that have improved transmittance ratio and a high light shielding ratio by randomly aligning the liquid crystal using a monomer having a random shape.

Further, still another object of the present invention is to provide a light controlling apparatus having a light shielding mode in which a color is displayed by light shielding or scattering light incident from the outside or a background of the device is invisible.

Furthermore, still another object of the present invention is to improve a shielding rate of the light controlling apparatus by using the wall in the liquid crystal unit to prevent coloring members from being tilted to a specific region and thus prevent a light leakage caused by coloring members distributed in a non-uniform manner within the liquid crystal unit.

Also, still another object of the present invention is to provide a light controlling apparatus that can be applied to a flexible display device.

The objects of the present invention are not limited to the aforementioned objects, and other objects, which are not mentioned above, will be apparent to a person having ordinary skill in the art from the following description.

According to an aspect of the present invention to achieve the above-described objects, there is provided a light controlling apparatus comprising: a first electrode unit and a second electrode unit facing each other; a liquid crystal unit between the first electrode unit and the second electrode unit, the liquid crystal unit including: a liquid crystal; a network having a first polymer polymerized from a first monomer having a similar shape as the liquid crystal and a second polymer polymerized from a second monomer having a shape different from the first monomer; and a wall having the first polymer and the second polymer.

According to another feature of the present invention, the light controlling apparatus further comprises a spacer on at least one among the first electrode unit and the second electrode unit.

According to yet another feature of the present invention, the first monomer and the second monomer include UV-hardened monomers.

According to still another feature of the present invention, UV wavelengths used for the UV-hardened monomers include same wavelength range.

According to still another feature of the present invention, the first monomer includes a RM (reactive mesogen)-based monomer.

According to still another feature of the present invention, the second monomer includes a Bisphenol A Dimethacrylate-based monomer.

According to still another feature of the present invention, the first monomer assists in vertical alignment of the liquid crystal and the second monomer assists in random alignment of the liquid crystal.

According to still another feature of the present invention, if the liquid crystal includes one among a negative type liquid crystal or a DFLC (dual frequency liquid crystal), each of the first electrode unit and the second electrode unit includes a common electrode.

According to still another feature of the present invention, if the liquid crystal includes the negative type liquid crystal, each of the first electrode unit and the second electrode unit is configured to apply a vertical electric field to the liquid crystal unit.

According to still another feature of the present invention, the light controlling apparatus exhibits a transparent mode with the liquid crystal in a homeotropic state when a voltage is not applied, and wherein the light controlling apparatus exhibits a light shielding mode with the liquid crystal in a random state when a voltage is applied.

According to still another feature of the present invention, if the liquid crystal includes one among a positive type liquid crystal or a DFLC (dual frequency liquid crystal), at least one among the first electrode unit and the second electrode unit includes a plurality of patterned electrodes.

According to still another feature of the present invention, if the liquid crystal includes one among a positive type liquid crystal or a DFLC (dual frequency liquid crystal), at least one among the first electrode unit and the second electrode unit includes a plurality of patterned electrodes.

According to still another feature of the present invention, the light controlling apparatus exhibits a transparent mode with the liquid crystal in a homeotropic state when a voltage is not applied, and wherein the light controlling apparatus exhibits a light shielding mode with the liquid crystal in a random state when a voltage is applied.

According to still another feature of the present invention, if the liquid crystal includes one among a positive type liquid crystal or a DFLC, at least one among the first electrode unit and the second electrode unit includes a plurality of patterned electrodes and a common electrode.

According to still another feature of the present invention, a horizontal electric field is applied to the patterned electrode and the common electrode.

According to still another feature of the present invention, the light controlling apparatus exhibits a transparent mode with the liquid crystal in a homeotropic state when a voltage is not applied, and wherein the light controlling apparatus exhibits a light shielding mode with the liquid crystal in a random state when a voltage is applied.

According to still another feature of the present invention, the light controlling apparatus further comprises an alignment unit configured to align the liquid crystal in a homeotropic state.

According to still another feature of the present invention, the alignment unit is on or under the liquid crystal unit.

According to another aspect of the present invention to achieve the above-described objects, there is provided a method of fabricating a light controlling apparatus, comprising: laminating a first electrode unit to a second electrode unit; forming a liquid crystal unit between the first electrode unit and the second electrode unit, the liquid crystal unit including a mixed liquid crystal having a first monomer, a second monomer and a liquid crystal; forming a wall corresponding to a pattern of a mask on the first electrode unit or on the second electrode unit by polymerizing the first monomer and the second monomer; and forming a network by polymerizing the first monomer and the second monomer with a lower irradiation energy than the forming the wall.

According to another feature of the present invention, the method further comprises disposing of a spacer on at least one among the first electrode unit and the second electrode unit.

According to yet another feature of the present invention, the first monomer and the second monomer are polymerized with a light having the same wavelength range.

According to still another feature of the present invention, each of the forming of the wall and the forming of the network includes polymerizing the first monomer and the second monomer by irradiation with UV rays.

According to still another feature of the present invention, the first monomer includes a RM (reactive mesogen)-based monomer.

According to still another feature of the present invention, the second monomer includes a Bisphenol A Dimethacrylate-based monomer.

According to yet another aspect of the present invention to achieve the above-described objects, there is provided a mixed liquid crystal in which a liquid crystal, a first monomer and a second monomer are present, wherein the first monomer has a similar shape as the liquid crystal and the second monomer has a shape different from the first monomer, and wherein the first monomer and the second monomer are configured to have both a network and a wall in a light controlling apparatus.

According to another feature of the present invention, the light controlling apparatus exhibits a transparent mode with the liquid crystal in a homeotropic state when a voltage is not applied, and wherein the light controlling apparatus exhibits a light shielding mode with the liquid crystal in a random state when a voltage is applied.

According to yet another feature of the present invention, the first monomer and the second monomer are cured by UV irradiation at the same wavelength range.

According to still another feature of the present invention, the first monomer includes an RM (reactive mesogen)-based monomer.

According to still another feature of the present invention, the second monomer includes a Bisphenol A Dimethacrylate-based monomer.

According to still another feature of the present invention, the first monomer and the second monomer are polymerized by irradiation with UV rays.

According to still another feature of the present invention, the liquid crystal includes one among a positive liquid crystal, a negative liquid crystal or a DFLC (dual frequency liquid crystal).

According to yet another aspect of the present invention to achieve the above-described objects, there is provided a display device comprising: a display panel; and at least one light controlling apparatus attached to the display panel.

According to another feature of the present invention, the display panel is an OLED panel.

According to yet another feature of the present invention, the light controlling apparatus is attached to the front surface of the display panel.

According to still another feature of the present invention, the light controlling apparatus is attached to the rear surface of the display panel.

Details of other exemplary embodiments will be included in the detailed description of the invention and the accompanying drawings.

The present invention can provide a light controlling apparatus that can exhibit in a transparent mode by transmitting light incident from the outside without applying a voltage.

Further, since a liquid crystal of the light controlling apparatus of the present invention has a state that transmits light incident from the outside in an initial state, the transparent mode can be realized in the initial state. Therefore, it is possible to reduce power consumption.

Furthermore, the present invention can provide the light controlling apparatus that can exhibit a light shielding mode in which a background of the light controlling apparatus is invisible by arranging a coloring member formed of a dye having a color so as to express black or other colors than black.

Also, the present invention can provide the light controlling apparatus including both of a network and a wall in a liquid crystal unit using two or more different monomers.

Further, the present invention can improve an effect of scattering light incident from the outside since a liquid crystal can have a state in a more random pattern due to the network positioned in the liquid crystal unit.

Furthermore, the present invention can improve a shielding rate of the light controlling apparatus by using the wall in the liquid crystal unit to suppress coloring members from being tilted to a specific region and thus to suppress a light leakage caused by coloring members distributed in a non-uniform manner within the liquid crystal unit.

Also, the present invention can be applied to a flexible display device since a shock applied from the outside can be absorbed due to the wall positioned within a liquid crystal unit.

Further, the present invention reduces the difference in refractive index by disposing a refractive index matching layer capable of compensating for a difference in refractive index between components in the light controlling apparatus. Thus, the transmittance ratio is improved.

Furthermore, the present invention can increase the driving reliability by preventing a short occurring within the light controlling apparatus through the wall or the refractive index matching layer.

Also, the present invention can improve the transmittance ratio of the light controlling apparatus since it can have a homeotropic state in which liquid crystals are perpendicular to an electrode unit.

The effects of the present invention are not limited to the aforementioned effects, and other various effects are included in the following description.

BRIEF DESCRIPTION OF THE DRAWINGS

The above and other aspects, features and other advantages of the present invention will be more clearly understood from the following detailed description taken in conjunction with the accompanying drawings, in which:

FIG. 11b is a cross-sectional view of the display device taken along a line XI-XI' of FIG. 11a.

FIG. 12b is a cross-sectional view of the display device taken along a line XII-XII' of FIG. 12a.

DETAILED DESCRIPTION OF THE INVENTION

Figure 1:
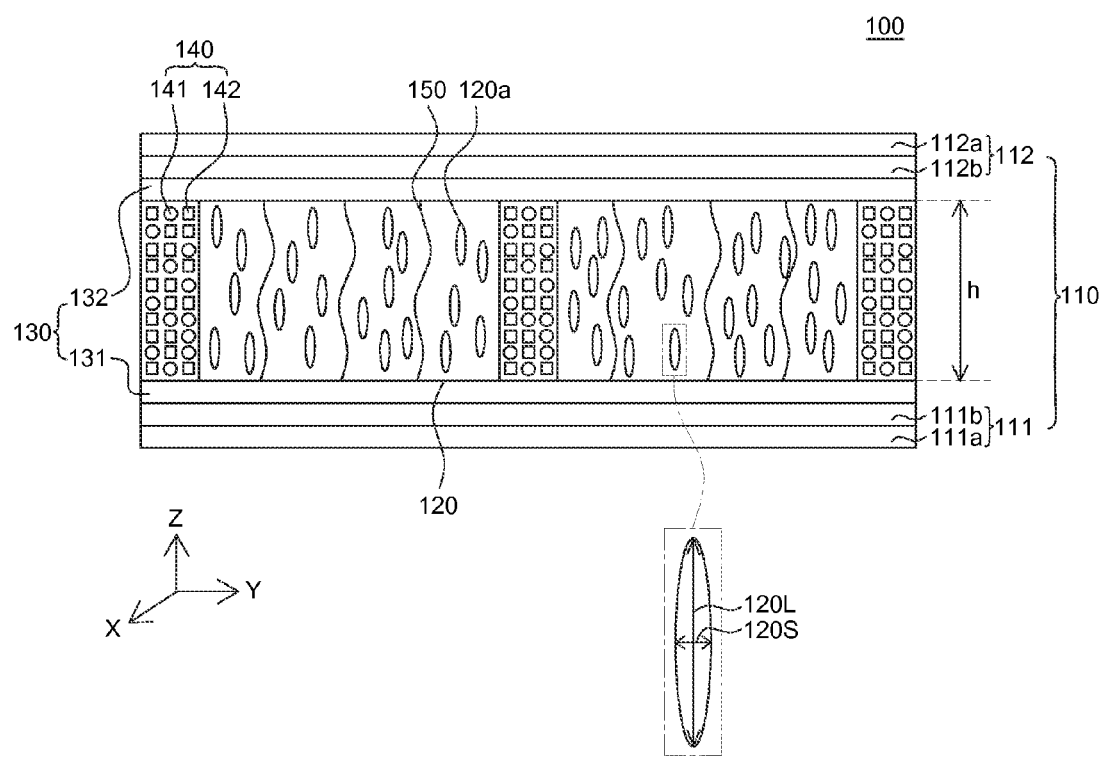
FIG. 1 is a cross-sectional view illustrating a transparent mode of a light controlling apparatus according to an exemplary embodiment of the present invention.

Advantages and features of the present invention, and methods for accomplishing the same will be more clearly understood from exemplary embodiments described below with reference to the accompanying drawings. However, the present invention is not limited to the following exemplary embodiments but may be implemented in various different forms. The exemplary embodiments are provided only to complete disclosure of the present invention and to fully provide a person having ordinary skill in the art to which the present invention pertains with the category of the invention, and the present invention will be defined by the appended claims.

The shapes, sizes, ratios, angles, numbers, and the like shown in the accompanying drawings for describing the exemplary embodiments of the present invention are merely examples, and the present invention is not limited thereto. Like reference numerals generally denote like elements throughout the present specification. Further, in the following description, a detailed explanation of known related technologies may be omitted to avoid unnecessarily obscuring the subject matter of the present disclosure.

The terms such as "including," "having," and "containing" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", "next" and the like, one or more parts may be positioned between the two parts unless the terms are used with the term "immediately" or "directly".

When the relation in order of time is described using the terms such as "after", "subsequent to", "next to", "before" and the like, discontinuous relations may be included unless the terms are used with the term "immediately" or "directly".

Although the terms "first", "second", and the like are used for describing various components, these components are not confined by these terms. These terms are merely used for distinguishing one component from the other components. Therefore, a first component to be mentioned below may be a second component in a technical concept of the present invention.

"X-axis direction", "Y-axis direction", and "Z-axis direction" should not be construed only as being in a geometric relationship in which these directions are perpendicular to each other, but may have a wider directionality in a range to which the configuration of the present invention can be functionally applied.

The term "at least one" should be understood as including all possible combinations which can be suggested from one or more relevant items. For example, the meaning of "at least one among a first item, a second item, and a third item" may be each one among the first item, the second item, or the third item and also be all possible combinations which can be suggested from two or more of the first item, the second item, and the third item.

The features of various embodiments of the present invention can be partially or entirely laminated to or combined with each other and can be interlocked and operated in technically various ways as can be fully understood by a person having ordinary skill in the art, and the embodiments can be carried out independently of or in association with each other.

Hereinafter, exemplary embodiments of the present invention will be described in detail with reference to the accompanying drawings.

Polymer dispersed liquid crystal (PDLC) and polymer networked liquid crystal (PNLC) used as a light controlling apparatus of a transparent display device have a different mixing ratio of monomers and a liquid crystal. Generally, the PDLC has a higher percentage of monomers than the PNLC. Therefore, the PDLC realizes an initial light shielding mode in which an incident light is scattered by a randomly aligned liquid crystal and polymerized monomers in an initial state where a voltage is not applied. Also, the PDLC realizes a transparent mode by transmitting an incident light without scattering when voltage is applied and thus the liquid crystal is vertically aligned. If the PDLC is used as a light controlling apparatus of a transparent display device, voltage needs to be continuously applied for realizing the transparent mode in a standby.

Accordingly, the inventors of the present invention conducted an experiment on the PNLC which is advantageous in realizing the transparent mode in the initial state where a voltage is not applied since the percentage of monomers is relatively low. However, the PNLC has a lower percentage of polymerized monomers than the PDLC, and, thus, has a low resistance to an external shock. Therefore, a wall for resisting the external shock is needed. However, it is recognized that if a wall is formed, it is difficult to form a network. If a network is formed, it is difficult to form a wall.

Thus, the inventors of the present invention recognized the above-described problems, and invented a light controlling apparatus having a new structure in which a wall and a network are formed so as to realize a transparent mode and a light shielding mode.

Details thereof will be described with reference to the following exemplary embodiments.

Figure 2:
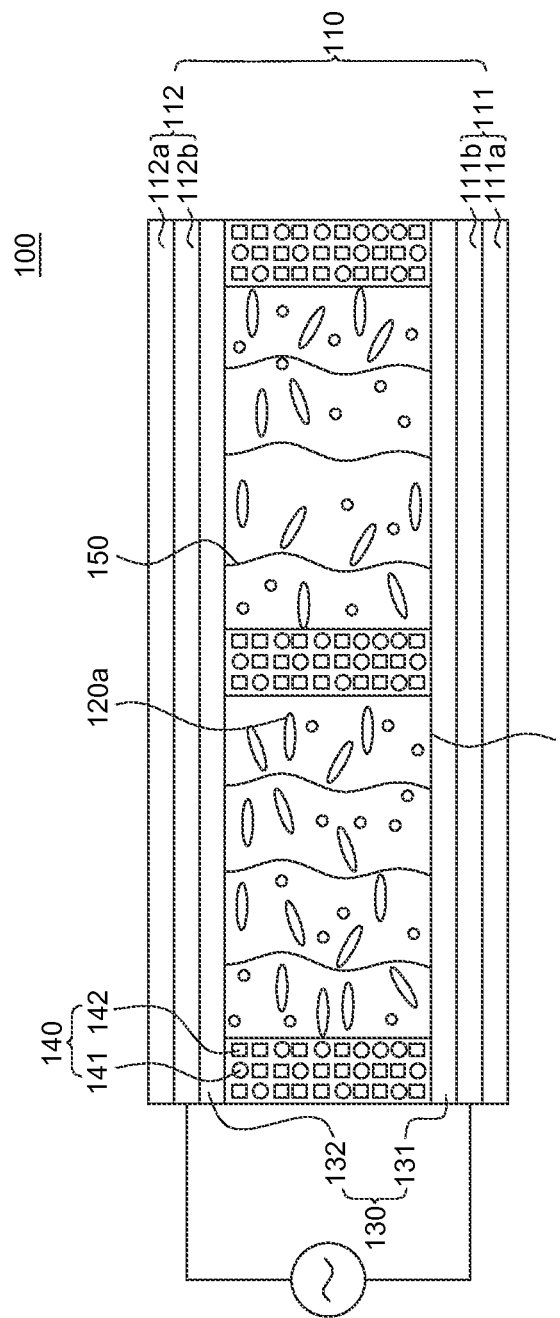
FIG. 2 is a cross-sectional view illustrating a light shielding mode of the light controlling apparatus illustrated in FIG. 1.

FIG. 1 is a cross-sectional view illustrating a transparent mode of a light controlling apparatus according to an exemplary embodiment of the present invention, and FIG. 2 is a cross-sectional view illustrating a light shielding mode of the light controlling apparatus illustrated in FIG. 1.

As illustrated in FIG. 1, a light controlling apparatus 100 according to an exemplary embodiment of the present invention includes an electrode unit 110, a liquid crystal unit 120, an alignment unit 130, a wall 140, a network 150, and a spacer.

The electrode unit 110 includes a first electrode unit 111 and a second electrode unit 112 provided to face each other, and the liquid crystal unit 120 is positioned between the first electrode unit 111 and the second electrode unit 112. The first electrode unit 111 includes a substrate 111a formed of a transparent material and an electrode 111b on the substrate 111a. The first electrode unit 111 and the second electrode unit 112 may have the same configuration, and the second electrode unit 112 also includes a substrate 112a and an electrode 112b in the same manner as the first electrode unit 111.

The substrate 111a of the first electrode unit 111 and the substrate 112a of the second electrode unit 112 may use, without limitation, a substrate used in manufacturing a general display device or flexible display device. To be more specific, transparent glass-based materials or transparent plastic-based materials may be used as materials of the substrates 111a and 112a. Sheets or films having cellulose resin such as TAC (triacetyl cellulose) or DAC (diacetyl cellulose), a COP (cyclic olefin polymer) such as norbornene derivatives, COC (cyclo olefin copolymer), acrylic resin such as PMMA (poly(methylmethacrylate)), polyolefin such as PC (polycarbonate), PE (polyethylene), or PP (polypropylene), polyester such as PVA (polyvinyl alcohol), PES (poly ether sulfone), PEEK (polyetheretherketone), PEI (polyetherimide), PEN (polyethylenenaphthalate), or PET (polyethyleneterephthalate), PI (polyimide), PSF (polysulfone), or fluoride resin may be used as the substrates 111a and 112a, but the present invention is not limited thereto.

The electrode 111b or 112b is disposed on one surface of the substrate 111a or 112a, respectively, and has an electrode shape without a pattern. The electrodes 111b and 112b may be formed of transparent conductive materials which have conductivity and also transmit external light. For example, the electrodes 111b and 112b may be formed of materials at least one among silver oxide (e.g.; AgO or $Ag_2O$ or $Ag_2O_3$), aluminum oxide (e.g.; $Al_2O_3$), tungsten oxide (e.g.; $WO_2$ or $WO_3$ or $W_2O_3$), magnesium oxide (e.g.; MgO), molybdenum oxide (e.g.; $MoO_3$), zinc oxide (e.g.; ZnO), tin oxide (e.g.; $SnO_2$), indium oxide (e.g.; $In_2O_3$), chromium oxide (e.g.; $CrO_3$ or $Cr_2O_3$), antimony oxide (e.g.; $Sb_2O_3$ or $Sb_2O_5$), titanium oxide (e.g.; $TiO_2$), nickel oxide (e.g.; NiO), copper oxide (e.g.; CuO or $Cu_2O$), vanadium oxide (e.g.; $V_2O_3$ or $V_2O_5$), cobalt oxide (e.g.; CoO), iron oxide (e.g.; $Fe_2O_3$ or $Fe_3O_4$), niobium oxide (e.g.; $Nb_2O_5$), indium tin oxide (e.g.; Indium Tin Oxide, ITO), indium zinc oxide (e.g.; Indium Zinc Oxide, IZO), aluminum doped zinc oxide (e.g.; Aluminum doped Zinc Oxide, ZAO), aluminum doped tin oxide (e.g.; Aluminum doped Tin Oxide, TAO), and antimony tin oxide (e.g.; Antimony Tin Oxide, ATO), but are not limited thereto.

Referring to FIG. 1, the alignment unit 130 is a member configured to align a liquid crystal 120a in the liquid crystal unit 120 in a homeotropic state as an initial state. In the present specification, the homeotropic state refers to a state where the liquid crystal 120a is perpendicularly aligned to the electrode unit 110. That is, the homeotropic state refers to a state where a long axis 120L of the liquid crystal 120a is perpendicularly aligned to the electrode unit 110 and a short axis 120S is horizontally aligned to the electrode unit 110.

The alignment unit 130 may be positioned on or under the liquid crystal unit 120. To be specific, the alignment unit 130 includes a first alignment member 131 between the first electrode unit 111 and light the liquid crystal unit 120 and a second alignment member 132 between the second electrode unit 112 and the liquid crystal unit 120. The first alignment member 131 and the second alignment member 132 constituting the alignment unit 130 are formed of vertical alignment materials. To be more specific, the alignment unit 130 may be formed of at least one among polyimide-based materials and phosphatidylcholine (PPC)-based materials, but is not limited thereto. In addition, the alignment unit 130 may be formed by mixing a vertical alignment material such as HTAB (hexadecyltrimethylammonium bromide) or CTAB (cetyl trimethyl ammonium bromide) in a solvent such as isopropyl alcohol (IPA). Then, the alignment unit 130 can be formed by coating the mixture on the first electrode unit 111 and the second electrode unit 112 and then evaporating the solvent.

Although FIG. 1 illustrates that the alignment unit 130 is positioned on and under the liquid crystal unit 120, the alignment unit 130 may be positioned either on or under the liquid crystal unit 120.

The liquid crystal unit 120 is positioned between the first electrode unit 111 and the second electrode unit 112. To be specific, referring to FIG. 1, the liquid crystal unit 120 is disposed between the first alignment member 131 and the second alignment member 132.

The liquid crystal unit 120 includes the liquid crystal 120a, the wall 140 and the network 150. The liquid crystal 120a may be at least one among a negative type liquid crystal or a DFLC (dual frequency liquid crystal). Driving methods of the light controlling apparatus 100 depending on a kind of the liquid crystal 120a will be described later.

In some exemplary embodiments, monomers for forming a first polymer 141 and a second polymer 142 may remain in the liquid crystal unit 120. Details thereof will be described together with the wall 140.

As illustrated in FIG. 1, the wall 140 is disposed in the light controlling apparatus 100. To be specific, the wall 140 is between the first electrode unit 111 and the second electrode unit 112. A position of the wall 140 within the light controlling apparatus 100 can be freely changed.

The wall 140 includes the first polymer 141 and the second polymer 142. The first polymer 141 and the second polymer 142 are formed of different monomers formed of transparent materials that transmit light.

Herein, for example, a monomer for forming the first polymer 141 is an RM (Reactive Mesogen)-based UV hardening monomer, and a monomer for forming the second polymer 142 is a Bisphenol A Dimethacrylate-based UV hardening monomer. For example, the first polymer 141 and the second polymer 142 may be formed by polymerizing different monomers by a UV hardening process. The monomers for forming the first polymer 141 and the second polymer 142 may be cured at a wavelength range of 350 to 380 nm. A wavelength range of light for hardening the monomers for forming the first polymer 141 and the second polymer 142 may be determined depending on materials for forming the substrates 111a and 112a. Hereinafter, it is assumed that the first polymer 141 is a polymer polymerized from a first monomer and the second polymer 142 is a polymer polymerized from a second monomer.

The first polymer 141 is a polymer having a similar shape with the liquid crystal 120a, and may be formed of the first monomer having a similar shape with the liquid crystal 120a. The first polymer is polymerized. Since the first polymer 141 polymerized from the first monomer has the same shape as the liquid crystal 120a, it can assist the alignment member 130 in aligning the liquid crystal 120a in a homeotropic state during a UV hardening process. That is, since the first monomer and the first polymer 141 polymerized from the first monomer has the same shape as the liquid crystal 120a, it can improve vertical alignment of the liquid crystal 120a during a UV hardening process.

The second polymer 142 is a polymer having a different shape from the liquid crystal 120a, and may be formed of the second monomer having a different shape from the liquid crystal 120a. In some embodiments, the second polymer 142 is a polymer having a random shape, and may be formed of the second monomer having various shapes. Since the second polymer 142 has a random shape, it can assist the liquid crystal 120a not to be aligned in one direction but to be aligned in a random manner in a light shielding mode of the light controlling apparatus 100. That is, the second polymer 142 polymerized from the second monomer has various shapes, the liquid crystal 120a can be aligned in various directions during a light shielding mode of the light controlling apparatus 100. Thus, scattering of light caused by the liquid crystal 120a may be increased.

The wall 140 including the first polymer 141 and the second polymer 142 formed of different monomers can protect the inside of the liquid crystal unit 120 against an external force. Therefore, the light controlling apparatus 100 including the above-described wall 140 can be applied to a flexible transparent display device. Further, the wall 140 can maintain a cell gap h of the liquid crystal unit 120 and also prevent a short caused by a contact between the first electrode unit 111 and the second electrode unit 112 when an external force is applied to the light controlling apparatus 100. Furthermore, the wall 140 can block the inside of the liquid crystal unit 120 by dividing an internal space of the light controlling apparatus 100. Also, the liquid crystal unit 120 may be formed by forming the liquid crystal 120a in each space defined by the wall.

A wavelength range of light for curing the first monomer for forming the first polymer 141 is the same as a wavelength range of light for curing the second monomer for forming the second monomer 142. Thus, the first polymer 141 and the second polymer 142 may have substantially the same percentage in the wall 140. That is, since the first monomer for forming the first polymer and the second monomer for forming the second monomer 142 reacts with light in the same wavelength range, an amount of the first polymer 141 and an amount of the second polymer 142 cured in the same process may be substantially the same. Thus, the first polymer 141 and the second polymer 142 may have substantially the same percentage in the wall 140.

In some exemplary embodiments, the monomers for forming the first polymer 141 and the second polymer 142 may remain in the wall 140 and the liquid crystal unit 120. If the monomers remain in a final product, the monomers become a polymer as time goes on, and, thus, the properties of the light controlling apparatus 100 may be changed. Therefore, the monomers may be cured with a polymer. However, the monomers for forming the first polymer 141 and the second polymer 142 may remain in the wall 140 and the liquid crystal unit 120 due to various factors in a fabricating process.

As illustrated in FIG. 1, the network 150 is disposed in the light controlling apparatus 100. To be specific, the network 150 is disposed between the first electrode unit 111 and the second electrode 112. A position of the network 150 in the light controlling apparatus 100 can be freely changed. The network 150 is distributed in a net shape in the liquid crystal unit 120. Therefore, when an electric field is applied to the liquid crystal unit 120 and a state of the liquid crystal 120a in the liquid crystal unit 120 is changed, the liquid crystal 120a around the network 150 is changed with a random tilt angle rather than being in a planar state. Herein, the planar state refers to a state where the short axis 120S of the liquid crystal 120a is aligned perpendicularly to the electrode unit 110 and the long axis 120L is aligned horizontally to the electrode unit 110. The change of a state of the liquid crystal 120a caused by application of an electric field to the liquid crystal unit 120 will be described later with reference to FIG. 2.

The network 150 includes two polymers like the above-described wall 140. The two polymers may be formed of the same materials as the first polymer 141 and the second polymer 142, respectively. That is, the two polymers having the network 150 are formed of different monomers formed of transparent materials that transmit light. For example, a monomer for forming the first polymer 141 is an RM (Reactive Mesogen)-based UV hardening monomer, and a monomer for forming the second polymer 142 is a Bisphenol A Dimethacrylate-based UV curable monomer. Herein, an RM (Reactive Mesogen)-based monomer may be a material having a rod-like liquid crystalline state. An end group of an RM (Reactive Mesogen)-based monomer can be polymerized with ultraviolet (UV) rays or heat. An end group which can be polymerized with UV may be at least one among acrylate, ethylene, acetylene, and styrene, but is not limited thereto. Further, an end group which can be polymerized with heat may be at least one among oxetane or epoxy, but is not limited thereto.

Since the network 150 is formed of the same polymers as the first polymer 141 and the second polymer 142, the first polymer 141 of the two polymers included in the network 150 can assist alignment of the liquid crystal 120a in a homeotropic state during a UV hardening process. Also, the second polymer 142 can assist the liquid crystal 120a not to be aligned in a specific direction but to be aligned in a random manner while the light controlling apparatus 100 is driven. Further, a wavelength range of light for hardening the monomer for forming the first polymer 141 is the same as a wavelength range of light for hardening the monomer for forming the second monomer 142. The first polymer 141 and the second polymer 142 may have substantially the same percentage in the network 150.

In some exemplary embodiments, the monomers for forming the first polymer 141 and the second polymer 142 may remain in the network 150 in the same manner as the wall 140.

Although not illustrated in FIG. 1, the spacer may be positioned between the first electrode unit 111 and the second electrode unit 112. To be more specific, the spacer may be disposed on the first electrode unit 111, the second electrode unit 112 or both the first electrode unit 111 and the second electrode unit 112. The spacer may have a ball shape or an elongated shape, but a shape of the spacer is not limited thereto. The spacer is dispersed in a liquid crystal unit and determines the cell gap h of the liquid crystal unit 120 and also supports the cell gap h. The spacer may be formed of a silica ($SiO_2$)-based material.

To be more specific, during the fabricating process of the light controlling apparatus 100, after the first electrode unit 111 and the second electrode unit 112 are laminated to each other, the liquid crystal 120a for forming the liquid crystal unit 120 is injected between the first electrode unit 111 and the second electrode unit 112. At this time, the spacer is positioned between the first electrode unit 111 and the second electrode unit 112 in order to maintain the cell gap. Then the first electrode unit 111 and the second electrode unit 112 are laminated or assembled to each other. At this time, the cell gap h of the light controlling apparatus 100 is determined and a height of the above-described wall 140 is also determined depending on a size (height) and the number of the spacers.

Hereinafter, driving methods of a transparent mode and a light shielding mode of the light controlling apparatus 100 will be described with reference to FIG. 1 and FIG. 2.

As illustrated in FIG. 1, the liquid crystal 120a in the liquid crystal unit 120 of the light controlling apparatus 100 is in a homeotropic state as an initial state. Thus, the light controlling apparatus 100 exhibits a transparent mode in which a light incident from the outside is transmitted. Herein, the initial state refers to a state where an electric field is not applied to the liquid crystal unit 120 constituting the light controlling apparatus 100. It also refers to a state where voltages are not applied to the first electrode unit 111 and the second electrode unit 112 constituting the electrode unit 110.

To be more specific, during the fabricating process of the light controlling apparatus 100, the liquid crystal 120a in the liquid crystal unit 120 is already aligned in a homeotropic state by the alignment unit 130, and the first polymers 141 in the wall 140 and the network 150. Therefore, in the initial state, a light incident from the outside passes through the liquid crystal unit 120. Thus, the light controlling apparatus 100 exhibits a transparent mode.

In other words, since the liquid crystal 120a in the liquid crystal unit 120 is cured in a homeotropic state by the first polymers 141 in the wall 140 and the network 150, and the alignment unit 130, the liquid crystal 120a in the liquid crystal unit 120 can maintain the homeotropic state in the initial state. Therefore, since the light controlling apparatus 100 has a state that transmits light incident from the outside in the initial state, the transparent mode can be realized in the initial state. Therefore, it is possible to reduce power consumption of the light controlling apparatus 100.

Then, as illustrated in FIG. 2, if an electric field is applied to the liquid crystal unit 120 by supplying voltages to the first and second electrode units 111 and 112 of the light controlling apparatus 100, the liquid crystal 120a in light the liquid crystal unit 120 is changed to be aligned from the homeotropic state to a random state including the planar state. The random state including the planar state refers to a state in which if an electric field is applied to the liquid crystal unit 120 and a state of the liquid crystal 120a is changed, most of the liquid crystals 120a are changed to the planar state. But the liquid crystal 120a adjacent to the network 150 has a state having a random tilt angle by the polymers in the network 150. Further, the random tilt angle means an angle which is not previously determined but randomly determined.

To be specific, if the liquid crystal 120a is a negative type liquid crystal, the short axis 120S of the liquid crystal 120a is moved in a direction of an electric field. Therefore, when a vertical electric field is formed by supplying voltages to the first electrode unit 111 and the second electrode unit 112, where the liquid crystal 120a can be changed to be aligned from the homeotropic state to the random state including the planar state. Herein, a difference in voltage applied to the first electrode unit 111 and the second electrode unit 112 is 5 V or more, but is not limited thereto.

Further, if the liquid crystal 120a is a DFLC of which a state is converted using a frequency, voltages having predetermined frequencies are applied to the first electrode unit 111 and the second electrode unit 112. For example, when certain voltages having frequencies of 10 KHz to 1 MHz are supplied, the liquid crystal 120a can be changed to be aligned from the homeotropic state to the random state including the planar state. However, the frequency is not limited thereto.

As described above, if voltages are applied to the first electrode unit 111 and the second electrode unit 112 and a state of the liquid crystal 120a in the liquid crystal unit 120 is changed, most of the liquid crystals 120a are changed from the homeotropic state to the planar state. However, the liquid crystal 120a adjacent to the network 150 is aligned with a random tilt angle rather than being aligned in the planar state. That is, since the network 150 includes the second polymer having a random shape, the liquid crystal 120a adjacent to the network 150 is in a random manner with a random tilt angle by the second polymer in the network 150 in a light shielding mode. Therefore, in the light shielding mode, the liquid crystal 120a aligned in the planar state in the liquid crystal unit 120 and also the liquid crystal 120a aligned in a random manner with a random tilt angle scatter light. Therefore, the liquid crystal 120a in the liquid crystal unit 120 is changed to be aligned from the homeotropic state to the random state including the planar state and thus scatters light. Meanwhile, since the wall 140 also includes the second polymer 142, the liquid crystal 120a adjacent to the wall 140 may be aligned in a random manner with a random tilt angle. However, the wall 140 has a much greater surface area than the network 150. Thus, the liquid crystal 120a adjacent to the wall 140 may be less tilted than the liquid crystal 120a adjacent to the network 150.

Therefore, if light is incident from the outside to the liquid crystal unit 120 in the light shielding mode, the light is scattered in the liquid crystal unit 120 since the liquid crystal 120a in the liquid crystal unit 120 maintains the random state.

Through the above-described process, if the liquid crystal unit 120 exhibits the light shielding mode, an opaque milky color, for example, an opaque white- or gray-based color is displayed. Therefore, a background of the light controlling apparatus 100 is invisible.

A method for converting the light shielding mode of the light controlling apparatus 100 to the transparent mode as illustrated in FIG. 1 is as follows. If the liquid crystal 120a in the liquid crystal unit 120 is a negative type liquid crystal, when the voltages supplied to the first electrode unit 111 and the second electrode unit 112 of the light controlling apparatus 100 are blocked, the liquid crystal 120a in the liquid crystal unit 120 is changed from the random state to the homeotropic state, and, thus, the light controlling apparatus 100 is converted into the transparent mode.

Further, if the liquid crystal unit 120 is a DFLC, when the voltages supplied to the first electrode unit 111 and the second electrode unit 112 of the light controlling apparatus 100 are blocked or voltages having predetermined frequencies are supplied, the liquid crystal 120a in the liquid crystal unit 120 is changed from the random state to the homeotropic state, and, thus, the light controlling apparatus 100 is converted into the transparent mode.

Therefore, the light controlling apparatus 100 according to an exemplary embodiment of the present invention can maintain the transparent mode in an initial state where voltages are not applied to the first electrode unit 111 and the second electrode unit 112. Also, the light controlling apparatus 100 can maintain the light shielding mode if voltages are applied to the first electrode unit 111 and the second electrode unit 112. Therefore, since the light controlling apparatus 100 can maintain the transparent mode in an initial state and also maintain the light shielding mode if necessary, power consumption of the light controlling apparatus 100 can be reduced. Thus, the light controlling apparatus 100 can be used as a glass window or a smart window in public facilities.

Figure 3:
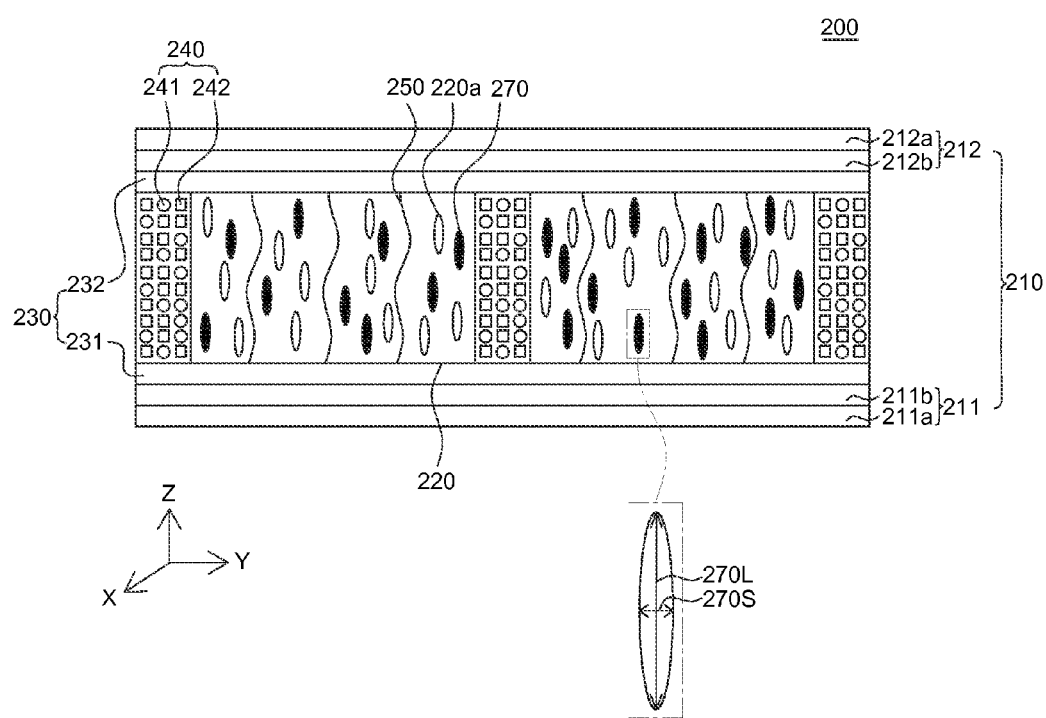
FIG. 3 is a cross-sectional view of a light controlling apparatus according to another exemplary embodiment of the present invention.

FIG. 3 is a cross-sectional view of a light controlling apparatus according to another exemplary embodiment of the present invention. In the present exemplary embodiment, descriptions about components identical or corresponding to those of the above-described exemplary embodiment will be omitted. Hereinafter, referring to FIG. 3, a light controlling apparatus 200 according to the present exemplary embodiment will be described.

As illustrated in FIG. 3, the light controlling apparatus 200 includes an electrode unit 210, a liquid crystal unit 220, an alignment unit 230, a wall 240, a network 250, a spacer, and a coloring member 270. To be more specific, the electrode unit 210, the liquid crystal unit 220, the alignment unit 230, the wall 240, the network 250, and the spacer constituting the light controlling apparatus 200 of the present exemplary embodiment are respectively identical to the electrode unit 110, the liquid crystal unit 120, the alignment unit 130, the wall 140, the network 150, and the spacer constituting the light controlling apparatus 100 described above with reference to FIG. 1 and FIG. 2. Therefore, redundant descriptions on the components described above with reference to FIG. 1 and FIG. 2 will be omitted.

Referring to FIG. 3, the light controlling apparatus 200 according to the present exemplary embodiment further includes the coloring member 270 in the liquid crystal unit 220.

To be more specific, the coloring member 270 may be formed of a dye having at least one color of black, red, green, blue, and yellow or a combination color thereof.

If the coloring member 270 is formed of a black-based dye and the light controlling apparatus 200 is driven in a light shielding mode, light scattered by a liquid crystal 220*a* in the liquid crystal unit 220 and the network 250 is finally absorbed by the coloring member 270. Thus, the light controlling apparatus 200 can exhibits the light shielding mode showing black and can maintain a black state.

Further, if the light controlling apparatus 200 is combined with a transparent display panel, the light controlling apparatus 200 needs to exhibit the light shielding mode which displays black while the transparent display panel is driven in order to provide a high image visibility to a user. In this case, the coloring member 270 may have a black color.

Further, as described above, if the coloring member 270 is formed of a dye having at least one color of black, red, green, blue, and yellow or a combination color thereof, the light controlling apparatus 200 can display a color of the coloring member 270 in the light shielding mode. Thus, the light controlling apparatus 200 according to the present exemplary embodiment can display various colors instead of black-based colors and also shield a background during the light shielding mode. Therefore, since the light controlling apparatus 200 according to the present exemplary embodiment can provide various colors during the light shielding mode, it is possible to provide an aesthetic effect to the user. For example, if the light controlling apparatus 200 is used in a public place, the light controlling apparatus 200 can be applied to a smart window or a public window in need of a transparent mode and a light shielding mode. Further, the light controlling apparatus 200 can display various colors depending on time or place and also shield light.

Further, the coloring member 270 is affected by a direction of the liquid crystal 220*a* and its alignment is changed. That is, since the coloring member 270 in an initial state is perpendicularly to the first electrode unit 211 or the second electrode unit 212 according to the liquid crystal 220*a* of the liquid crystal unit 220, as a long axis 270L of the coloring member 270 is longer and a short axis 270S thereof is shorter, a high transmittance ratio can be maintained during a transparent mode. Also, a high light shielding ratio can be maintained during alight shielding mode.

To be more specific, referring to FIG. 3, since the liquid crystal 220*a* is aligned perpendicularly to the first electrode unit 211 or the second electrode unit 212 in an initial state where an electric field is not applied, the coloring member 270 is also aligned in a homeotropic state where the coloring member 270 is perpendicular to the first electrode unit 211 or the second electrode unit 212. Therefore, light reaches the short axis 270S having a smaller length than the long axis 270L of the coloring member 270 in the initial state where an electric field is not applied. Thus, an amount of light absorbed by the liquid crystal unit 220 is very small and most of the light is transmitted through the liquid crystal unit 220. Therefore, the light controlling apparatus 200 can exhibit a transparent mode in which a transparent mode is maintained.

That is, in a state where an electric field is not applied to the liquid crystal unit 220, the liquid crystal 220*a* in the liquid crystal unit 220 transmits light. At this time, the light reaches a very small area of the coloring member 270. Thus, the light controlling apparatus 200 can maintain a transparent mode.

Further, if the light controlling apparatus 200 exhibits a light shielding mode, the coloring member 270 lies according to a lying direction of the adjacent liquid crystal 220*a* (i.e., alignment direction of the liquid crystal 220*a*) affected by an electric field. An alignment direction of the coloring member 270 is changed since the liquid crystal 220*a* is in a liquid state and the coloring member 270 is in a solid state or a state close to a solid. As a result, alignment of the solid coloring member 270 is changed according to a flowing direction of the liquid (i.e., a direction in which a state of the liquid crystal 220*a* is changed). That is, in a state where the electric field illustrated in FIG. 2 is applied, the liquid crystal 220*a* is aligned in a random state including a planar state having a random tilt angle. Thus, the coloring member 270 may be affected by the adjacent liquid crystal 220*a* and may be aligned in a planar state or may be aligned in a random manner. For example, the liquid crystal 220*a* lies in an X-direction, the adjacent coloring member 270 lies in the X-direction along the liquid crystal 220*a* and the long axis 270L of the coloring member 270 is aligned in parallel with the first and second electrode units 211 and 212. Further, the liquid crystal 220*a* lies in a Y-direction, the adjacent coloring member 270 lies in the Y-direction along the liquid crystal 220*a* and the long axis 270L of the coloring member 270 is aligned in parallel with the first and second electrode units 211 and 212. Furthermore, the coloring member 270 around the network 250 may be aligned in a random manner with a random tilt angle in the same manner as the liquid crystal 220*a* around the network 250. That is, when an electric field is formed in the liquid crystal unit 220 and a state of the liquid crystal 220*a* in the liquid crystal unit 220 is changed, the coloring member 270 around the network 250 is aligned in a random manner with a random tilt angle rather than being aligned in a planar state. Therefore, a light scattered by the liquid crystal 220*a* and the network 250 reaches the long axis 270L having a greater length than the short axis 270S of the coloring member 270. At this time, the light reaches a very large area of the coloring member 270. Thus, most of the light is absorbed by the coloring member 270. Therefore, the light controlling apparatus 200 can be in a light shielding mode in which a light shielding mode is maintained while displaying color held in the coloring member 270.

Since the wall 240 is formed in the liquid crystal unit 220, it is possible to prevent the concentration of the inside of the liquid crystal unit 220, i.e., the coloring member 270 mixed together with the liquid crystal 220*a*, in a specific region. To be more specific, the inside of the liquid crystal unit 220 is divided into several sections (or regions) by the wall 240. Also, the coloring member 270 positioned in each section cannot be moved to another section. If the wall 240 is not present in the liquid crystal unit 220, the coloring member 270 may be moved in the liquid crystal unit 270 depending on an external pressure or a implementation state of the light controlling apparatus 200. Therefore, in a state where the coloring member 270 is not uniformly distributed in the entire liquid crystal unit 220, if the light controlling apparatus 200 exhibits a light shielding mode, a light leakage may occur at some regions. However, in the light controlling apparatus 200 of the present exemplary embodiment having a structure in which the wall 240 is disposed in the liquid crystal unit 220 and the coloring member 270 is positioned in a section formed by the wall 240, movement of the coloring member 280 is very limited. Further, the light controlling apparatus 200 can exhibit a light shielding mode in an overall uniform manner. Thus, in the light shielding mode of the light controlling apparatus 200, the light shielding ratio can be increased.

A weight ratio of the coloring member 270 can be determined depending on a kind of a display device to which the light controlling apparatus 200 is applied. For example, if the light controlling apparatus 200 is a transparent display device placed indoors, it is important that the light controlling apparatus 200 has a high transmittance ratio in a transparent mode. Therefore, preferably, the coloring member 270 may have a relatively low weight ratio. Further, if the light controlling apparatus 200 is a transparent display device placed outdoors, it is important that the light controlling apparatus 200 has a high shielding ratio in alight shielding mode. Therefore, preferably, the coloring member 270 may have a relatively high weight ratio. In some exemplary embodiments, the coloring member 270 may have a weight ratio of 1 wt %, but is not limited thereto.

Figure 4:
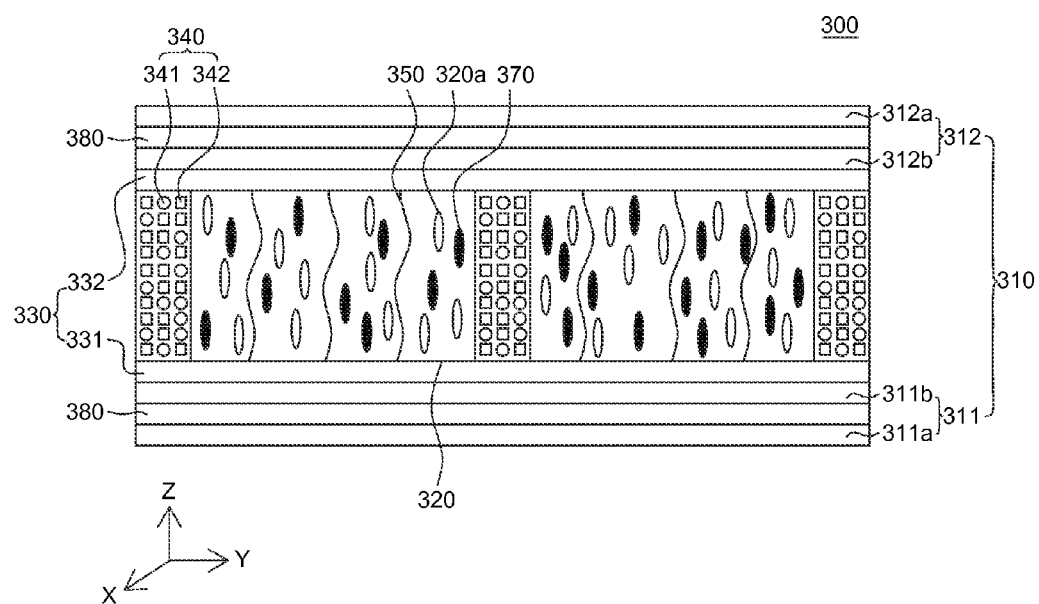
FIG. 4 is a cross-sectional view of a light controlling apparatus according to yet another exemplary embodiment of the present invention.

FIG. 4 is a cross-sectional view of a light controlling apparatus according to yet another exemplary embodiment of the present invention. In the present exemplary embodiment, descriptions on components identical or corresponding to those of the above-described exemplary embodiments will be omitted. Hereinafter, referring to FIG. 4, a light controlling apparatus according to the present exemplary embodiment will be described.

As illustrated in FIG. 4, alight controlling apparatus 300 includes an electrode unit 310, a liquid crystal unit 320, an alignment unit 330, a wall 340, a network 350, a spacer, a coloring member 370, and a refractive index matching layer 380. To be more specific, the electrode unit 310, the liquid crystal unit 320, the alignment unit 330, the wall 340, the network 350, and the spacer constituting the light controlling apparatus 300 of the present exemplary embodiment are respectively identical to the electrode unit 110, the liquid crystal unit 120, the alignment unit 130, the wall 140, the network 150, and the spacer constituting the light controlling apparatus 100 described above with reference to FIG. 1 and FIG. 2. Further, the coloring member 370 constituting the light controlling apparatus 300 is identical to the coloring member 270 described above with reference to FIG. 3. Therefore, redundant descriptions about the components described above with reference to FIG. 1 to FIG. 3 will be omitted.

Referring to FIG. 4, the light controlling apparatus 300 further includes the refractive index matching layer 380. As illustrated in FIG. 4, the refractive index matching layer 380 is positioned in the electrode unit 310. To be more specific, the refractive index matching layer 380 is positioned between a substrate 311a and an electrode 311b in a first electrode unit 311 and between a substrate 312a and an electrode 312b in a second electrode unit 312.

Otherwise, the refractive index matching layer 380 may be positioned between the electrode unit 310 and the alignment unit 330. For example, the refractive index matching layer 380 may be positioned between the electrode 311b constituting the first electrode unit 311 and a first alignment member 331 constituting the alignment unit 330. Or, the refractive index matching layer 380 may be positioned between the electrode 312b constituting the second electrode unit 312 and a second alignment member 332 constituting the alignment unit 330.

Further, the refractive index matching layer 380 may be positioned between the alignment unit 330 and the liquid crystal unit 320. To be more specific, the refractive index matching layer 380 may be positioned between the liquid crystal unit 320 and the first alignment member 331 and/or between the liquid crystal unit 320 and the second alignment member 332.

That is, the refractive index matching layer 380 is positioned between the components having a difference in refractive index among the components constituting the light controlling apparatus 300, so that light incident from the outside can pass through the inside of the light controlling apparatus 300 without having much loss possible.

The refractive index matching layer 380 may be formed of at least one among a polymer, an OCA (optical clear adhesive) as one among optical transparent adhesives, and an organic compound adhesive such as a thermally or UV curable organic polymer compound, and has a refractive index of 1.3 to 1.9. The first electrode unit 311 and the second electrode unit 312 constituting the light controlling apparatus 300 of the present invention may have a refractive index in the range of 1.6 to 1.8. Also, a liquid crystal 320a in the liquid crystal unit 320 may have a refractive index in the range of 1.3 to 1.6. For example, the substrates 311a and 312a may have a refractive index of about 1.6, and the substrates 311b and 312b may have a refractive index of about 1.8. Generally, the alignment unit 330 may be configured to be identical in a refractive index to the liquid crystal 320a in the liquid crystal unit 320.

As such, each component constituting the light controlling apparatus 300 may have a different refractive index. If the refractive index matching layer 380 is adapted, a difference in refractive index can be compensated. That is, the refractive index matching layer 380 offsets a difference in refractive index within the first electrode unit 311 and a difference in refractive index within the second electrode unit 312. Thus, light incident from the outside can pass through the inside of the light controlling apparatus 300 without having much loss.

Therefore, while the light controlling apparatus 300 maintains a transparent mode in a transparent mode, an improved transmittance ratio can be provided to the user. Further, while the light controlling apparatus 300 maintains a shielding state in a light shielding mode, an improved shielding ratio can be provided to the user.

Hereinafter, there will be described an example where the light controlling apparatus 300 exhibits a transparent mode.

In a state where an electric field is not applied to the liquid crystal 320a in the liquid crystal unit 320, when light passing through the substrate 311a of the first electrode unit 311 is incident into the electrode 311b, the light can be scattered in a direction to the substrate 311a due to a difference in refractive index between the substrate 311a and the electrode 311b. Further, when light passing through the first alignment member 331 is incident into the liquid crystal unit 320, the light can be scattered in a direction to the first electrode 311 due to a difference in refractive index. Furthermore, when light passing through the liquid crystal unit 320 and the alignment unit 330 passes through the second electrode unit 312, the light can be scattered again in a direction to the liquid crystal unit 320 due to a difference in refractive index between the electrode 312b and the substrate 312a. As such, if the light controlling apparatus 300 is in a transparent mode, light is scattered due to a difference in refractive index between components. Also, a part of the light cannot pass through the light controlling apparatus 300. Thus, the transmittance ratio of the light controlling apparatus 300 may be decreased.

Meanwhile, if the refractive index matching layer 380 is disposed in the light controlling apparatus 300 in consideration of a difference in refractive index between the components, when a light passes through the light controlling apparatus 300 while the light controlling apparatus 300 exhibits a transparent mode, the light is not scattered. That is, differences in refractive index between the substrates 311a and 312a and the electrodes 311b and 312b, a difference in refractive index between the electrode unit 310 and the alignment unit 330, and a difference in refractive index between the liquid crystal unit 320 and the alignment unit 330 can be reduced by the refractive index matching layer 380. Therefore, while the light controlling apparatus 300 exhibits a transparent mode, light incident from the outside can pass through the inside of the light controlling apparatus 300 without having much loss. Thus, a high transmittance ratio can be provided to the user.

Further, even when the light controlling apparatus 300 is in a light shielding mode, unnecessary scattering for shielding occurs due to a difference in refractive index between the components. Thus, a light scattering ratio and a light shielding ratio may be decreased. Meanwhile, if the refractive index matching layer 380 is disposed in the light controlling apparatus 300 in consideration of a difference in refractive index between the components, while the light controlling apparatus 300 exhibits a light shielding mode, a scattered light is moved in a direction to the liquid crystal unit 320 without having much loss. Also, most of the light reaches the coloring member 370. Thus, a high light shielding ratio can be provided to the user.

Furthermore, as described above, since the refractive index matching layer 380 may be formed of at least one among a polymer, an OCA (optical clear adhesive) as one among optical transparent adhesives, and an organic compound adhesive such as a thermally or UV curable organic polymer compound, it is possible to prevent a short which may occur in the light controlling apparatus 300. To be more specific, an impurity may be mixed with the liquid crystal 320a in the liquid crystal unit 320 during a fabricating process of the light controlling apparatus 300. The impurity may serve as a conductor that enables electric connection between the electrode 311a of the first electrode unit 311 and the electrode 312a of the second electrode unit 312. Thus, a short may occur between the electrode 311a and the electrode 312a in the light controlling apparatus 300.

However, since the refractive index matching layer 380 according to an exemplary embodiment of the present invention is formed of the above-described material, it can serve as an insulator. Therefore, the refractive index matching layer 380 can prevent occurrence of a short in the light controlling apparatus 300 and thus can increase the driving reliability of the light controlling apparatus 300.

Therefore, the refractive index matching layer 380 can improve transmittance ratio and a light shielding ratio of the light controlling apparatus 300 and also increase the driving reliability of the light controlling apparatus 300.

In some embodiments, the refractive index matching layer may not be adapted.

Figure 5:
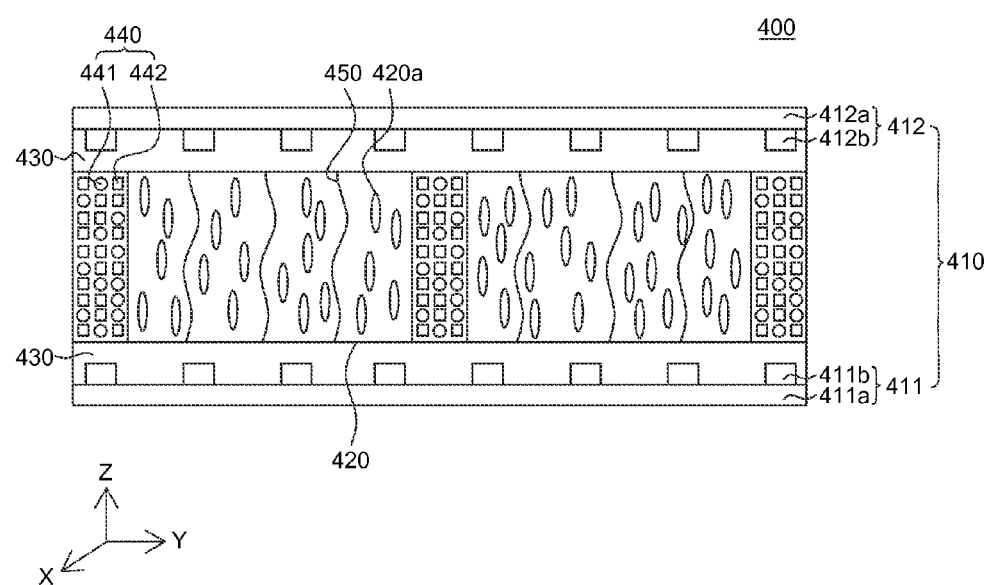
FIG. 5 is a cross-sectional view of a light controlling apparatus according to still another exemplary embodiment of the present invention.
Figure 6:
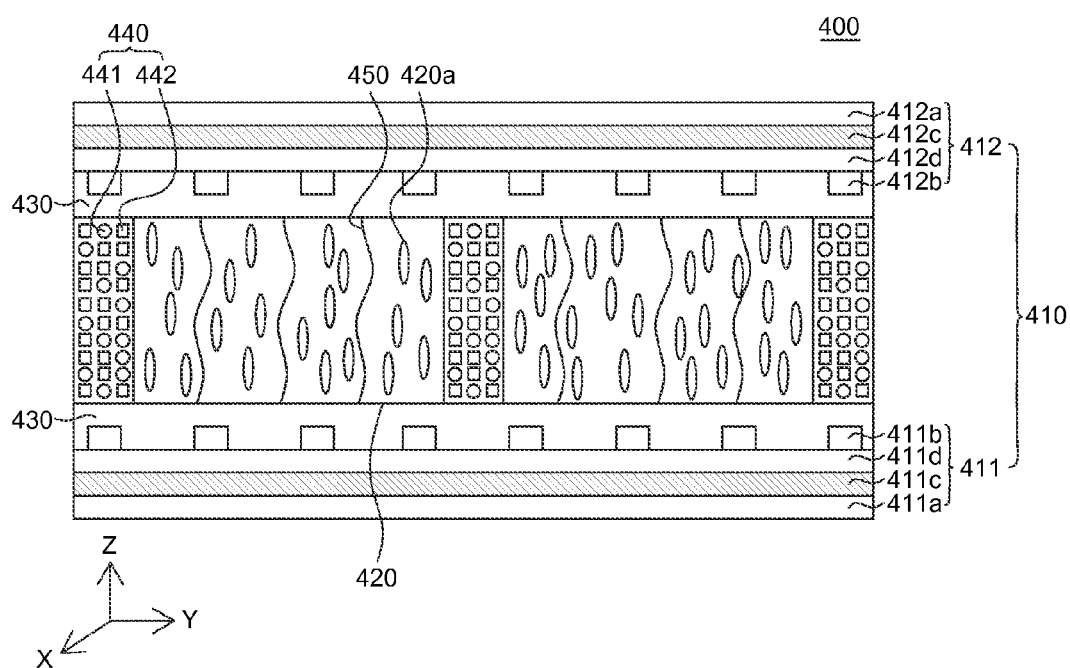
FIG. 6 is a cross-sectional view of a light controlling apparatus according to another exemplary embodiment of an electrode unit illustrated in FIG. 5.

FIG. 5 is a cross-sectional view of a light controlling apparatus according to still another exemplary embodiment of the present invention, and FIG. 6 is a cross-sectional view of a light controlling apparatus according to another exemplary embodiment of an electrode unit illustrated in FIG. 5. In the present exemplary embodiment, descriptions on components identical or corresponding to those of the above-described exemplary embodiments will be omitted. Hereinafter, referring to FIG. 5 and FIG. 6, a light controlling apparatus according to the present exemplary embodiment will be described.

As illustrated in FIG. 5 and FIG. 6, a light controlling apparatus 400 according to an exemplary embodiment of the present invention includes an electrode unit 410, a liquid crystal unit 420, an alignment unit 430, a wall 440, a network 450, and a spacer. To be more specific, the alignment unit 430, the wall 440, the network 450, and the spacer constituting the light controlling apparatus 400 of the present exemplary embodiment are respectively identical to the alignment unit 130, the wall 140, the network 150, and the spacer constituting the light controlling apparatus 100 described above with reference to FIG. 1 and FIG. 2. Therefore, redundant descriptions on the components described above with reference to FIG. 1 to FIG. 2 will be omitted.

The liquid crystal unit 420 includes a liquid crystal 420a. The liquid crystal 420a constituting the liquid crystal unit 420 may include one among a positive type liquid crystal or a DFLC. A driving method of the light controlling apparatus 400 depending on a kind of the liquid crystal 420a will be described later.

As illustrated in FIG. 5, the electrode unit 410 constituting the light controlling apparatus 400 includes a first electrode unit 411 and a second electrode unit 412 provided to face each other, and the liquid crystal unit 420 may be positioned between the first electrode unit 411 and the second electrode unit 412. The first electrode unit 411 includes a substrate 411a formed of a transparent material and an electrode 411b on the substrate 411a. The electrode 411b includes a plurality of patterned electrodes. Further, the second electrode unit 412 also includes a substrate 412a and an electrode 412b in the same manner as the first electrode unit 411. The electrode 412b includes a plurality of patterned electrodes. Further, the electrodes 411b and 412b may be formed to have a straight shape or a zigzag shape in a plane view. The zigzag shape means that at least one among the electrodes 411b and 412b includes a bending portion, and the zigzag shape may include at least one bending portion.

Also, the patterned electrodes 411b and 412b of the first and second electrode units 411 and 412, respectively, are configured to apply a horizontal electric field to the liquid crystal 420a in the liquid crystal unit 420. Herein, as illustrated in FIG. 5, if all of the first and second electrode units 411 and 412 include patterned electrodes 411b and 412b, when a horizontal electric field is applied from the first and second electrode units 411 and 412, an electric field which can change a state of the liquid crystal 420a is generated. Thus, even if a low voltage is applied, the liquid crystal 420a can be easily changed from a homeotropic state to a random state, as compared with a case where the patterned electrodes 411b and 412b are formed on one side only. Voltages applied to the patterned electrodes 411b and 412b adjacent to each other may have different polarities. For example, if a positive (+) voltage is applied to any one among the patterned electrodes 411b and 412b, a negative (−) voltage may be applied to the other patterned electrode 411b or 412b adjacent thereto. That is, the odd-number patterned electrodes 411b and 412b are applied with the same voltage as the odd-number patterned electrodes 411b and 412b, and the even-number patterned number patterned electrodes 411b and 412b are applied with the same voltage as the even-number patterned electrodes 411b and 412b. Therefore, a voltage difference is formed between a plurality of the patterned electrodes 411b and 412b adjacent to each other. Thus, a horizontal electric field may be applied to the patterned electrodes 411b and 412. Further, the patterned electrodes 411b and 412b facing each other may be configured to be applied with voltages having the same polarity.

Herein, a difference in voltage applied to the pattern electrodes 411b and 412b adjacent to each other 5 V or more, but is not limited thereto. The substrates 411a and 412a are respectively identical to the substrates 111a and 112a described above with reference to FIG. 1. Further, materials of the electrodes 411b and 412b constituting the first and second electrode units 411 and 412, respectively, are identical to those of the electrodes 111b and 112b described above with reference to FIG. 1.

Otherwise, a patterned electrode may be formed in only one among the first electrode unit 411 or the second electrode unit 412. In this case, the first electrode unit 411 may include a patterned electrode, and the second electrode unit 412 may include a non-patterned electrode. Alternatively, the first electrode unit 411 may include a non-patterned electrode, and the second electrode unit 412 may include a patterned electrode. Herein, a driving method of an electrode unit including a patterned electrode is the same as described above. Thus redundant descriptions thereof will be omitted.

Hereinafter, driving methods of a transparent mode and a light shielding mode of the light controlling apparatus 400 illustrated in FIG. 5 will be described.

Referring to FIG. 5, the liquid crystal 420a in the liquid crystal unit 420 of the light controlling apparatus 400 is in a homeotropic state as an initial state regardless of whether the liquid crystal 420a is a positive type liquid crystal or a DFLC. Thus in the initial state, the light controlling apparatus 400 exhibits a transparent mode in which a light incident from the outside is transmitted.

To be more specific, during a fabricating process of the light controlling apparatus 400, the liquid crystal 420a in the liquid crystal unit 420 is already aligned in a homeotropic state by the alignment unit 430 and first polymers 441 included in the wall 440 and the network 450. Therefore, in the initial state, a light incident from the outside passes through the liquid crystal unit 420, and the light controlling apparatus 400 exhibits a transparent mode in which a background is visible.

Then, if an electric field is applied to the liquid crystal unit 420 by supplying voltages to the first and second electrode units 411 and 412 of the light controlling apparatus 400, the liquid crystal 420a in the liquid crystal unit 420 is changed to be aligned from the homeotropic state to a random state including a planar state with a random tilt angle.

To be specific, if the liquid crystal 420a in the liquid crystal unit 420 is a positive type liquid crystal, the long axis of the liquid crystal 420a is moved in a direction to an electric field. Therefore, when a horizontal electric field is applied by supplying voltages to the first electrode unit 411 and the second electrode unit 412, the liquid crystal 420a can be changed to be aligned from the homeotropic state to the random state including the planar state with a random tilt angle. To be specific, each patterned electrode 411b of the first electrode unit 411 is configured to be applied with a voltage having a different polarity from the adjacent patterned electrode 411b. Also, each patterned electrode 412b of the second electrode unit 412 is configured to be applied with a voltage having a different polarity from the adjacent patterned electrode 412b. For example, if a positive (+) voltage is applied to at least one patterned electrode, a negative (−) voltage may be applied to a patterned electrode adjacent to the patterned electrode. Herein, a difference in voltage applied to the adjacent patterned electrodes is 5 V or more, but is not limited thereto.

Further, if the liquid crystal 420a in the liquid crystal unit 420 is a DFLC of which a state is converted using a frequency, voltages having predetermined frequencies are applied to the first electrode unit 411 and the second electrode unit 412. For example, when certain driving voltages having frequencies of 10 KHz to 1 MHz are supplied, the liquid crystal 420a can be changed to be aligned from the homeotropic state to the random state including the planar state with a random tilt angle. However, the frequency of the voltages is not limited thereto.

Accordingly, if light is incident from the outside to the liquid crystal unit 420, since the liquid crystal 420a in the liquid crystal unit 420 maintains a random state with a random tilt angle, the light is scattered within the liquid crystal unit 420. As described above, since the network 450 is provided within the liquid crystal unit 420, the light is more scattered randomly in the liquid crystal unit 420. Through the above-described process, if the liquid crystal unit 420 exhibits the light shielding mode, an opaque milky color, for example, an opaque white- or gray-based color is displayed. Therefore, the light incident from the outside can be shielded.

Further, a method for converting the light shielding mode to the transparent mode is as follows. If the liquid crystal 420a in the liquid crystal unit 420 is a positive type liquid crystal, when the voltages supplied to the first electrode unit 411 and the second electrode unit 412 of the light controlling apparatus 400 are blocked, the liquid crystal 420a in the liquid crystal unit 420 is changed from the random state with a random tilt angle to the homeotropic state. Thus, the light controlling apparatus 400 is converted into the transparent mode.

Further, if the liquid crystal unit 420 is a DFLC, when the voltages supplied to the first electrode unit 411 and the second electrode unit 412 of the light controlling apparatus 400 are blocked or voltages having predetermined frequencies are supplied, the liquid crystal 420a in the liquid crystal unit 420 is changed from the random state with a random tilt angle to the homeotropic state. Thus, the light controlling apparatus 400 is converted into the transparent mode.

Referring to FIG. 6 showing a cross-sectional view of a light controlling apparatus according to another exemplary embodiment of the electrode unit, the first electrode unit 411 and the second electrode unit 412 constituting the electrode unit 410 may further include common electrodes 411c and 412c and insulating layers 411d and 412d, respectively.

To be specific, as illustrated in FIG. 6, if the first electrode unit 411 includes the substrate 411a, the plurality of patterned electrodes 411b, the common electrode 411c, and the insulating layer 411d, the common electrode 411c is positioned on the substrate 411a, the insulating layer 411d is positioned on the common electrode 411c, and the patterned electrodes 411b are positioned on the insulating layer 411d. As illustrated in FIG. 6, the common electrode 411c may be formed on the entire region of the substrate 411a or may be patterned as a unit of a specific region. Therefore, the common electrode 411c may be disposed so as to overlap with the first electrodes 411b of a plurality of patterned electrodes. The insulating layer 411d may be formed of an inorganic insulating material such as a silicon nitride or silicon oxide including SiNx, SiOx, etc., but is not necessarily limited thereto. In addition, the insulating layer 411d may be formed of an organic insulating material such as photo acryl or benzocyclobutene (BCB).

Further, if the second electrode unit 412 includes the substrate 412a, the plurality of patterned electrodes 412b, the common electrode 412c, and the insulating layer 412d, the common electrode 412c is positioned under the substrate 412a, the insulating layer 412d is positioned under the common electrode 412c, and the patterned electrodes 412b are positioned under the insulating layer 412d. As illustrated in FIG. 6, the common electrode 412c may be formed on the entire region of the substrate 412a or may be patterned as a unit of a specific region. Therefore, the common electrode 412c may be disposed so as to overlap with the plurality of patterned electrodes 412b. The insulating layer 412d of the second electrode unit 412 may be formed of the same material as the insulating material 411d of the first electrode unit 411.

Hereinafter, driving methods of a transparent mode and a light shielding mode of the light controlling apparatus 400 illustrated in FIG. 6 will be described.

Referring to FIG. 6, the liquid crystal 420a in the liquid crystal unit 420 of the light controlling apparatus 400 is in a homeotropic state as an initial state regardless of whether the liquid crystal 420a is a positive type liquid crystal or a DFLC. Thus, in the initial state, the light controlling apparatus 400 exhibits a transparent mode in which a light incident from the outside is transmitted.

Then, if an electric field is applied to the liquid crystal unit 420 by supplying voltages to the first and second electrode units 411 and 412 of the light controlling apparatus 400, the liquid crystal 420a in the liquid crystal unit 420 is changed to be aligned from the homeotropic state to the random state including a planar state with a random tilt angle.

To be specific, if the liquid crystal 420a in the liquid crystal unit 420 is a positive type liquid crystal, the long axis of the liquid crystal 420a is moved in a direction to an electric field. Therefore, when a horizontal electric field is applied by supplying voltages to the first electrode unit 411 and the second electrode unit 412, the liquid crystal 420a can be changed to be aligned from the homeotropic state to the random state including the planar state with a random tilt angle. To be specific, each patterned electrode 411b of the first electrode unit 411 is configured to be applied with a voltage having a different polarity from the common electrode 411c. Also, each patterned electrode 412b of the second electrode unit 412 is configured to be applied with a voltage having a different polarity from the common electrode 412c. Thus, a horizontal electric field is applied to the patterned electrode 411b and the common electrode 411c of the first electrode unit 411 and a horizontal electric field is applied to the patterned electrode 412b of the common electrode 412c of the second electrode unit 412. For example, if a positive (+) voltage is applied to the patterned electrodes 411b and 412b, a negative (−) voltage may be applied to the common electrodes 411c and 412c. Therefore, a voltage difference is formed between the patterned electrode 411b of the first electrode unit 411 and the common electrode 411c. A horizontal electric field is applied to the liquid crystal unit 420, and a voltage difference is formed between the patterned electrode 412b of the second electrode unit 412 and the common electrode 412c. A horizontal electric field is applied to the liquid crystal unit 420. Also, the patterned electrodes 411b and 412b facing each other may be configured to be applied with voltages having the same polarity.

Further, if the liquid crystal 420a in the liquid crystal unit 420 is a DFLC of which a state is converted using a frequency, voltages having predetermined frequencies are applied to the first electrode unit 411 and the second electrode unit 412. For example, when certain driving voltages having frequencies of 10 KHz to 1 MHz are supplied, the liquid crystal 420a can be changed to be aligned from the homeotropic state to the random state including the planar state with a random tilt angle. However, the frequency of the voltages is not limited thereto.

Accordingly, if light is incident from the outside to the liquid crystal unit 420, since the liquid crystal 420a in the liquid crystal unit 420 maintains a random state with a random tilt angle, the light is scattered in the liquid crystal unit 420.

Further, a method for converting the light shielding mode to the transparent mode is the same as the method described above with reference to FIG. 5.

In the exemplary embodiment illustrated in FIG. 5 and FIG. 6, the light controlling apparatus 400 according to the exemplary embodiment of the present invention can maintain a transparent mode in an initial state and maintain a light shielding mode when voltages are applied to the first electrode unit 411 and the second electrode unit 412. Therefore, since the light controlling apparatus 400 can maintain the transparent mode in an initial state and also maintain the light shielding mode if necessary, power consumption of the light controlling apparatus 400 can be reduced. Thus, the light controlling apparatus 400 can be used as a glass window or a smart window in public facilities.

Although FIG. 5 illustrates that both of the first electrode unit 411 and the second electrode unit 412 include a plurality of patterned electrodes, only one among the first electrode unit 411 and the second electrode unit 412 may include a plurality of patterned electrodes. In addition, although FIG. 6 illustrates that both of the first electrode unit 411 and the second electrode unit 412 include a plurality of patterned electrodes and a common electrode, only one among the first electrode unit 411 and the second electrode unit 412 may include a plurality of patterned electrodes and a common electrode.

Figure 7:
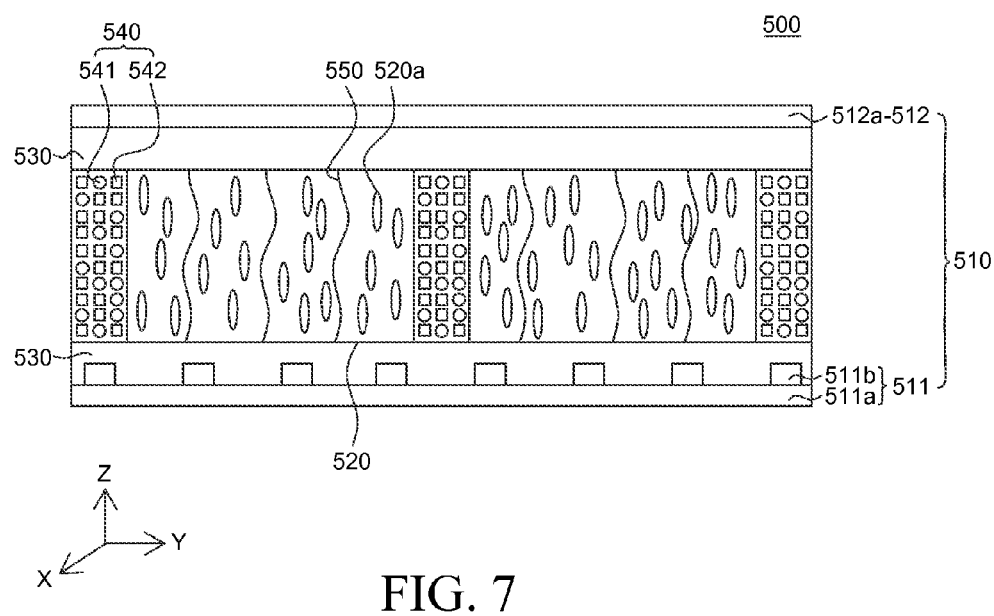
FIG. 7 is a cross-sectional view of a light controlling apparatus according to yet another exemplary embodiment of an electrode unit illustrated in FIG. 5.

FIG. 7 is a cross-sectional view of a light controlling apparatus according to still another exemplary embodiment of the present invention. In the present exemplary embodiment, descriptions about components identical or corresponding to those of the above-described exemplary embodiments will be omitted. Hereinafter, referring to FIG. 7, a light controlling apparatus according to the present exemplary embodiment will be described.

As illustrated in FIG. 7, alight controlling apparatus 500 includes an electrode unit 510, a liquid crystal unit 520, an alignment unit 530, a wall 540, a network 550, and a spacer. To be more specific, the alignment unit 530, the wall 540, the network 550, and the spacer constituting the light controlling apparatus 500 of the present exemplary embodiment are respectively identical to the alignment unit 430, the wall 440, the network 450, and the spacer constituting the light controlling apparatus 400 described above with reference to FIG. 5. Therefore, redundant descriptions about the components described above with reference to FIG. 5 will be omitted.

As illustrated in FIG. 7, the electrode unit 510 constituting the light controlling apparatus 500 includes a first electrode unit 511 and a second electrode unit 512 provided to face each other, and the liquid crystal unit 520 may be positioned between the first electrode unit 511 and the second electrode unit 512. The first electrode unit 511 includes a substrate 511a formed of a transparent material and an electrode 511b positioned on the substrate 511a. The electrode 511b includes a plurality of patterned electrodes. However, the second electrode unit 512 includes only a substrate 512a formed of a transparent material but does not include an electrode on the substrate. That is, only the first electrode unit 511 among the first electrode unit 511 and the second electrode unit 512 includes the plurality of patterned electrodes 511b and the second electrode unit 512 does not include an electrode. The patterned electrode 511b of the first electrode unit 511 is configured to apply a horizontal electric field to a liquid crystal 520a in the liquid crystal unit 520. Herein, a driving method of the first electrode unit 511 including the patterned electrode 511b is the same as the method described above with reference to FIG. 5. Thus, redundant descriptions thereof will be omitted. The substrates 511a and 512a are respectively identical to the substrates 111a and 112a described above with reference to FIG. 1. Further, a material of the electrode 511b constituting the first electrode unit 511 is identical to the material of the electrode 111b described above with reference to FIG. 1.

Although not illustrated in FIG. 7, the second electrode unit 512 may include a plurality of patterned electrodes and the first electrode unit 511 may not include an electrode.

Figure 8:
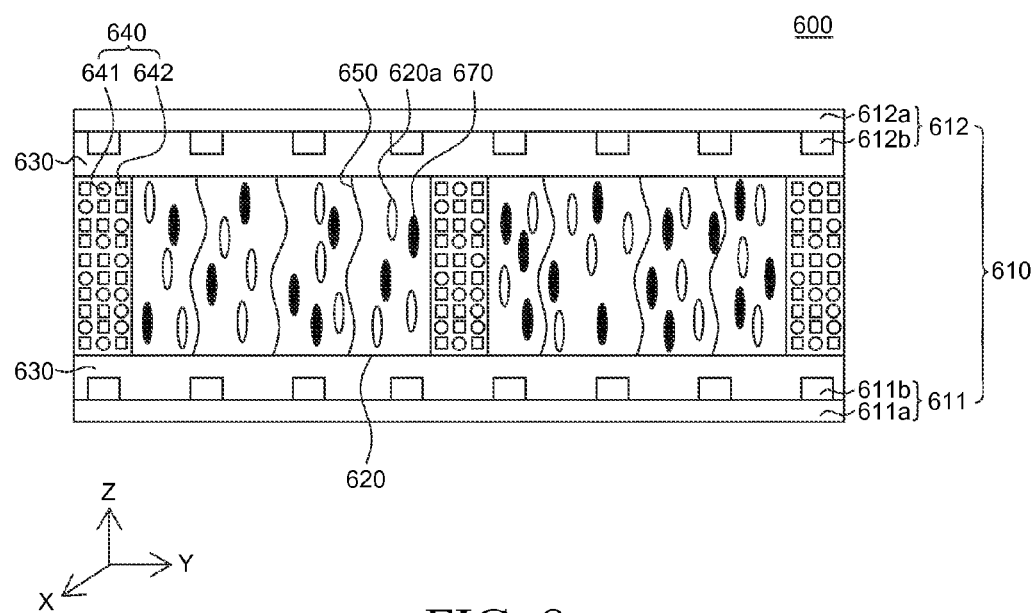
FIG. 8 is a cross-sectional view of a light controlling apparatus according to still another exemplary embodiment of the present invention.

FIG. 8 is a cross-sectional view of a light controlling apparatus according to still another exemplary embodiment of the present invention. In the present exemplary embodiment, descriptions about components identical or corresponding to those of the above-described exemplary embodiments will be omitted. Hereinafter, referring to FIG. 8, a light controlling apparatus according to the present exemplary embodiment will be described.

As illustrated in FIG. 8, a light controlling apparatus 600 includes an electrode unit 610, a liquid crystal unit 620, an alignment unit 630, a wall 640, a network 650, a spacer, and a coloring member 670. To be more specific, the electrode unit 610, the liquid crystal unit 620, the alignment unit 630, the wall 640, the network 650, and the spacer constituting the light controlling apparatus 600 of the present exemplary embodiment are respectively identical to the electrode unit 410, the liquid crystal unit 420, the alignment unit 430, the wall 440, the network 450, and the spacer constituting the light controlling apparatus 400 described above with reference to FIG. 5 and FIG. 6. Therefore, redundant descriptions about the components described above with reference to FIG. 5 and FIG. 6 will be omitted.

Referring to FIG. 8, the light controlling apparatus 600 according to the present exemplary embodiment further includes the coloring member 670 positioned in the liquid crystal unit 620. The coloring member 670 according to the present exemplary embodiment is identical to the coloring member 270 described above with reference to FIG. 3. That is, the coloring member 670 may be formed of a dye having any one color of black, red, green, blue, and yellow or a combination color thereof.

Thus, the light controlling apparatus 600 according to the present exemplary embodiment can display various colors as well as black-based colors and also shield a background while exhibits the light shielding mode. Further, since the light controlling apparatus 600 according to the exemplary embodiment of the present invention can provide various colors during the light shielding mode, it is possible to provide an aesthetic effect to the user. For example, the light controlling apparatus 600 can be used in a public place, and if the light controlling apparatus 600 is applied to a smart window or a public window in need of a transparent mode and a light shielding mode, the light controlling apparatus 500 can display various colors depending on time or place and also shield a light. In addition, a role, an effect, and a driving method of the coloring member 670 according to the present exemplary embodiment are identical to those of the coloring member 270 described above with reference to FIG. 3.

Figure 9:
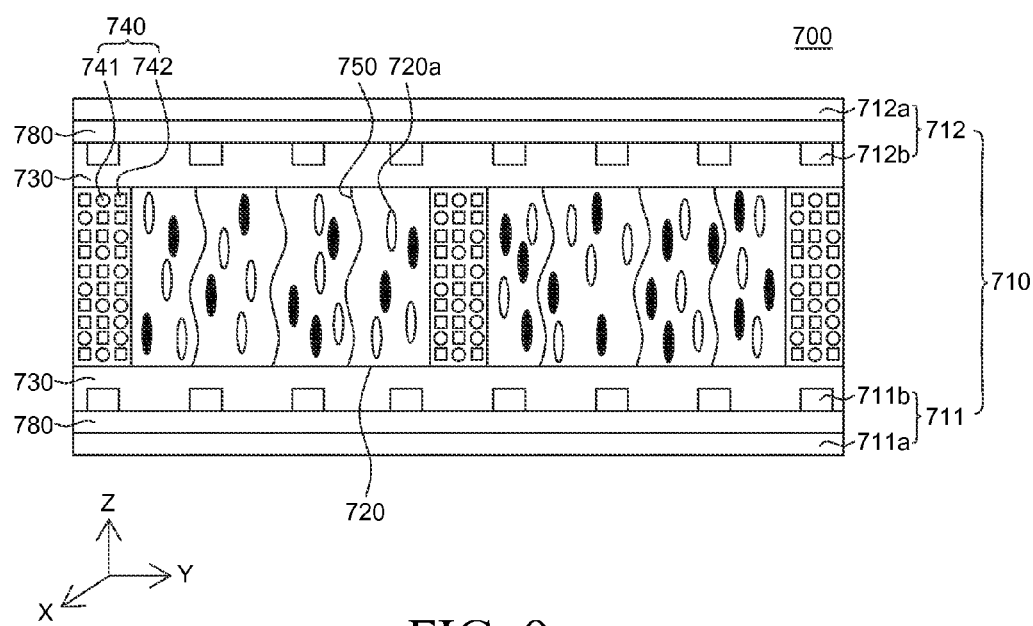
FIG. 9 is a cross-sectional view of a light controlling apparatus according to still another exemplary embodiment of the present invention.

FIG. 9 is a cross-sectional view of a light controlling apparatus according to still another exemplary embodiment of the present invention. In the present exemplary embodiment, descriptions about components identical or corresponding to those of the above-described exemplary embodiments will be omitted. Hereinafter, referring to FIG. 9, a light controlling apparatus according to the present exemplary embodiment will be described.

As illustrated in FIG. 9, a light controlling apparatus 700 includes an electrode unit 710, a liquid crystal unit 720, an alignment unit 730, a wall 740, a network 750, a spacer, a coloring member 770, and a refractive index matching layer 780. To be more specific, the electrode unit 710, the liquid crystal unit 720, the alignment unit 730, the wall 740, the network 750, and the spacer constituting the light controlling apparatus 700 of the present exemplary embodiment are respectively identical to the electrode unit 410, the liquid crystal unit 420, the alignment unit 430, the wall 440, the network 450, and the spacer constituting the light controlling apparatus 400 described above with reference to FIG. 5. Further, the coloring member 770 constituting the light controlling apparatus 700 is identical to the coloring member 670 described above with reference to FIG. 8.

Referring to FIG. 9, the light controlling apparatus 700 further includes the refractive index matching layer 780. Herein, a role, an effect, and a function of the refractive index matching layer 780 according to the present exemplary embodiment are identical to those of the refractive index matching layer 380 described above with reference to FIG. 4. Therefore, redundant descriptions on the components described above with reference to FIG. 4 to FIG. 8 will be omitted.

The refractive index matching layer 780 compensates a difference in refractive index between the components constituting the light controlling apparatus 700. Thus, the refractive index matching layer 780 provides an improved transmittance ratio as compared with a case where the light controlling apparatus 700 exhibits a transparent mode, and also provides an improved light shielding ratio as compared with a case where the light controlling apparatus 700 exhibits a light shielding mode. Further, since the refractive index matching layer 780 is formed of an insulating material, the refractive index matching layer 780 can prevent occurrence of a short within the light controlling apparatus 700 and thus can increase driving reliability of the light controlling apparatus 700.

Hereinafter, a fabricating process of a light controlling apparatus according to the exemplary embodiments of the present invention will be described with reference to FIG. 10a to FIG. 10f which are schematic sequence diagrams of the fabricating process of the light controlling apparatus according to the exemplary embodiments of the present invention. FIG. 10a to FIG. 10f illustrate a fabricating process of the light controlling apparatus 100 illustrated in FIG. 1.

Figure 10A:
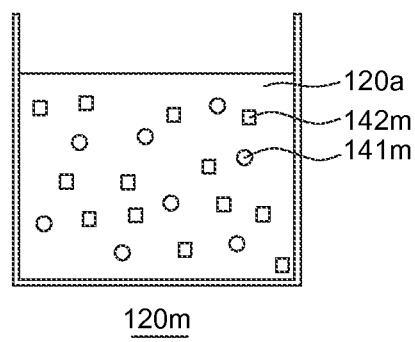
FIG. 10a to FIG. 10f are schematic sequence diagrams of a fabricating process of a light controlling apparatus according to the exemplary embodiments of the present invention.

As illustrated in FIG. 10a, a mixed liquid crystal 120m, in which a first monomer 141m, a second monomer 142m, and the liquid crystal 120a are mixed, is prepared. Herein, the liquid crystal 120a is at least one among a negative type liquid crystal, a positive type liquid crystal, or a DFLC. Among the monomers 141m and 142m different from each other, the first monomer 141m is a monomer for forming the first polymer 141 and the second monomer 142m is a monomer for forming the second polymer 142.

Herein, a ratio of the liquid crystal 120a to the monomers 141m and 142m may be 80:20 to 95:5. If the liquid crystal 120a is less than 80 wt % of the mixed liquid crystal 120m, the scattering of light caused by the liquid crystal 120a may not occur well. If the liquid crystal 120a is more than 95 wt % of the mixed liquid crystal 120m, the scattering of light caused by the liquid crystal 120a may excessively occur, which may cause a transparent mode not to be realized well. Thus, the ratio of the liquid crystal 120a to the monomers 141m and 142m may be 80:20 to 95:5. Further, a ratio of the first monomer 141m to the second monomer 142m may be 1:1 to 1:2.5 that is not regarded to a ratio of the liquid crystal 120a to the first and second monomers 141m and 142m.

In some exemplary embodiments, the mixed liquid crystal 120m may further include the coloring member 270, 370, 670 or 770 illustrated in FIG. 3, FIG. 4, FIG. 8 and FIG. 9. Further, since the coloring members 270, 370, 670 and 770 are relatively small in amount as compared with the liquid crystal 120a and the monomers 141m and 142m, and the amount of the coloring members 270, 370, 670 and 770 does not affect the ratio of the monomers 141m and 142m, the ratio of monomers 141m and 142m is the same as described above regardless of presence or absence of the coloring members 270, 370, 670 and 770.

Figure 10B:
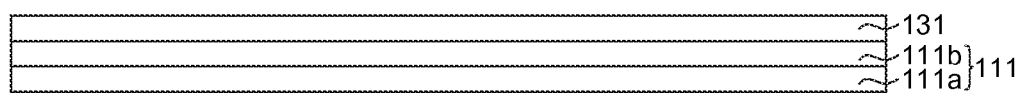
Figure 10B:

Then, as illustrated in FIG. 10b, the first electrode unit 111 and the second electrode unit 112 are prepared. To be specific, the electrode 111b is disposed on one surface of the substrate 111a and the electrode 112b is disposed on one surface of the substrate 112a to prepare the first electrode unit 111 and the second electrode unit 112. In addition, as illustrated in FIG. 10b, the first alignment member 131 may be disposed on the first electrode unit 111 and the second alignment member 132 may be disposed on the second electrode unit 112.

Then, the spacer is positioned on at least one among the first electrode unit 111 or the second electrode unit 112. For example, the spacer may be positioned on the first electrode unit 111, or the spacer may be positioned on the second electrode unit 112.

Then, the first electrode unit 111 and the second electrode unit 112 are laminated or assembled to each other with the spacer interposed therebetween.

Figure 10C:
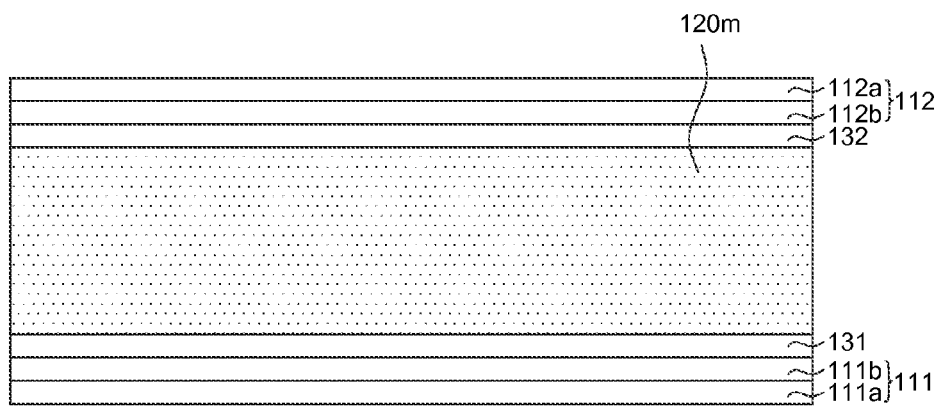

Then, as illustrated in FIG. 10c, in a state where the cell gap is formed by the spacer, a mixed liquid crystal unit having the mixed liquid crystal 120m is formed in the first electrode unit 111 and the second electrode unit 112. To be more specific, in a state where the first electrode unit 111 and the second electrode unit 112 are laminated or assembled to each other, the mixed liquid crystal 120m may be formed between the first electrode unit 111 and the second electrode unit 112 by an injection method using a capillary phenomenon.

In some exemplary embodiments, if the first electrode unit 111 and the second electrode unit 112 are laminated or assembled to each other using a roll-to-roll process, the mixed liquid crystal may be formed between the first electrode unit 111 and the second electrode unit 112. The mixing can be achieved by a squeeze method in which the mixed liquid crystal is injected at the same time when the roll-to-roll process is performed.

Figure 10D:
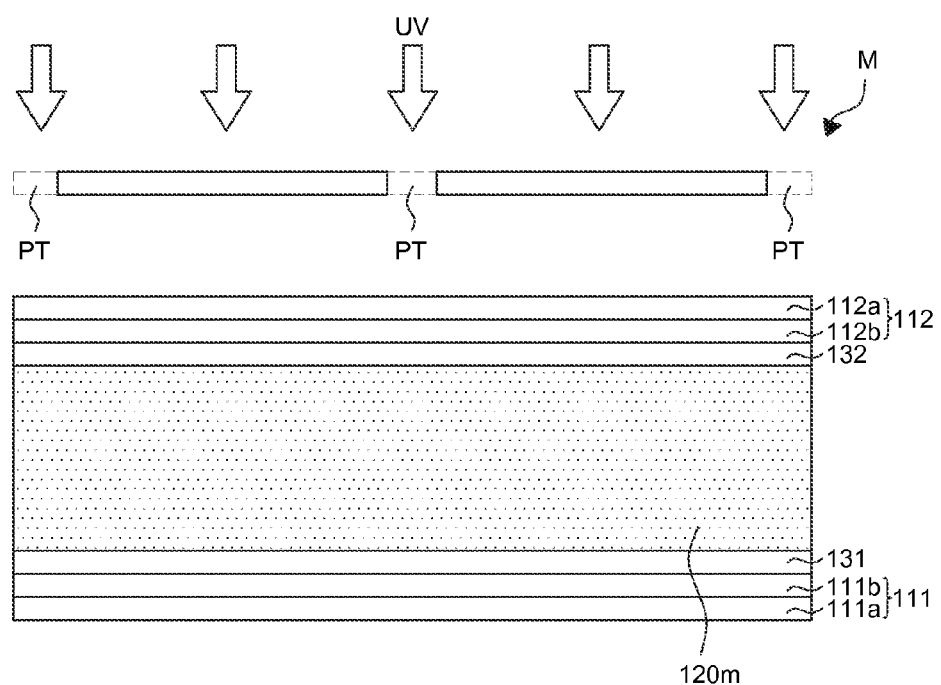
Figure 10E:
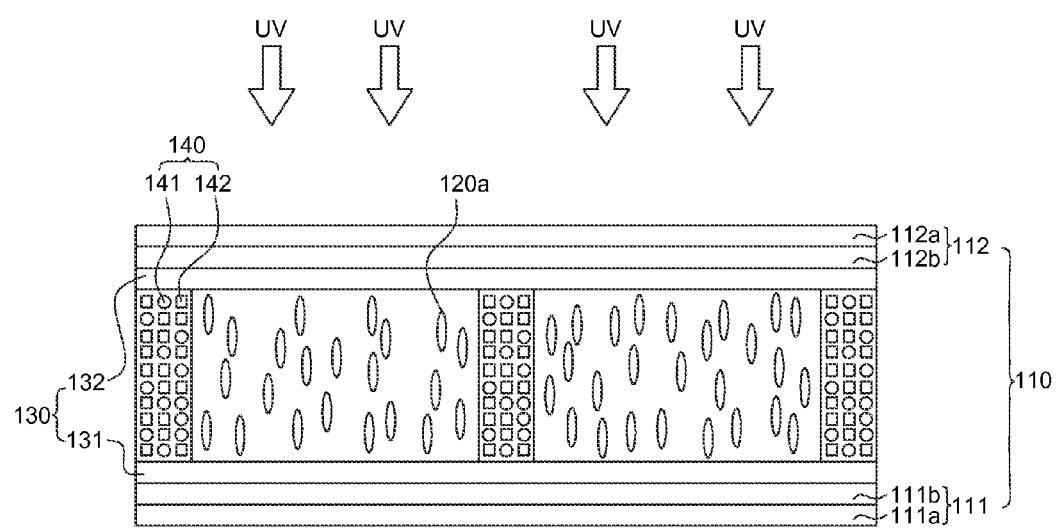

Then, as illustrated in FIG. 10d and FIG. 10e, after a mask M having a pattern PT is positioned, the first and second monomers 141m and 142m are cured using UV rays so as to form the wall 140 in a region corresponding to the pattern PT. For example, the curing process may be performed by irradiating UV rays having a wavelength of 365 nm with an intensity of 10 to 100 mW for 10 to 60 minutes. At this time, the wall 140 is formed in the region corresponding to the pattern PT, and the wall 140 includes the first polymer 141 and the second polymer 142 respectively polymerized from the first monomers 141m and the second monomers 142m by curing.

To be more specific, the first and second monomers 141m and 142m present in a region where the UV rays are irradiated, i.e., the region corresponding to the pattern PT of the mask M, are cured while being phase-separated from the mixed liquid crystal 120m. As the curing process proceeds, the monomers are converted into polymers in the cured region. As the curing process proceeds, the first and second monomers 141m and 142m present in a region where the UV rays are not irradiated are moved to the polymers within the mixed liquid crystal 120m. Therefore, the first and second monomers 141m and 142m dispersed throughout the mixed liquid crystal 120m are concentrated in the region where the curing process proceeds. Finally, the wall 140 including the first and second polymers 141 and 142 is formed.

Herein, the first monomer 141m is a monomer having the same shape as the liquid crystal 120a. Since the first monomer 141m has the same shape as the liquid crystal 120a, it can assist homeotropic state of the liquid crystal 120a during a UV curing process. That is, since the first monomer 141m has the same shape as the liquid crystal 120a, it can improve vertical alignment of the liquid crystal 120a during a UV curing process.

Figure 10F:
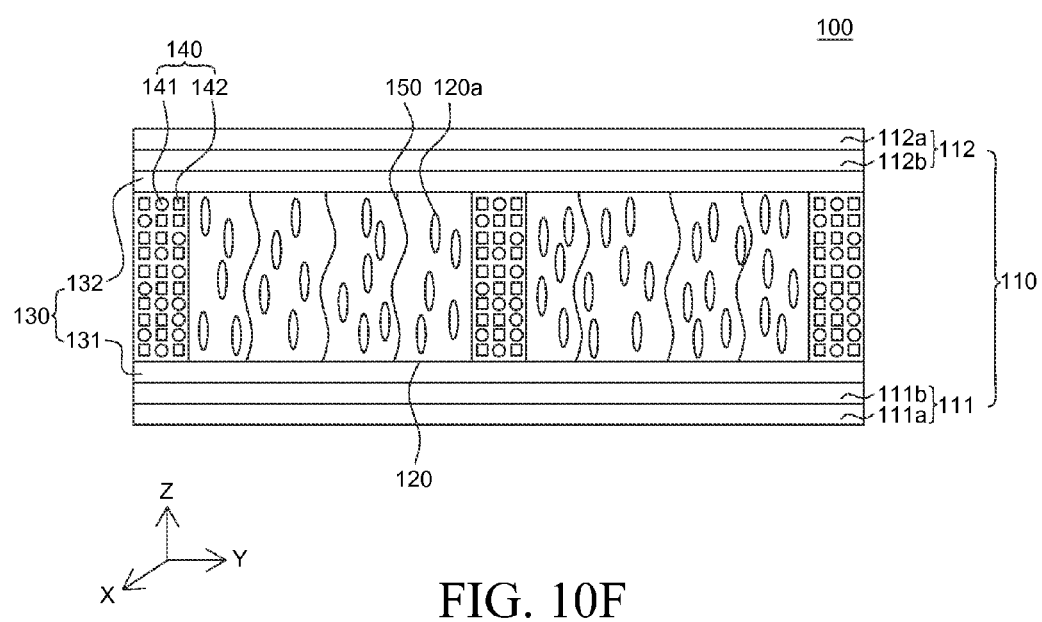

Then, as illustrated in FIG. 10e and FIG. 10f, the first and second monomers 141m and 142m in the entire region are cured using UV rays for shorter irradiation energy than the time for forming a wall, so that the network 150 is formed. For example, the curing process may be performed by irradiating UV rays having a wavelength of 365 nm with an intensity of 10 to 300 mW for 3 to 100 seconds. Further, UV irradiation energy is determined depending on UV irradiation time and irradiation intensity. Herein, the curing process is performed by varying an irradiation time. Otherwise, the curing process may also be performed by varying irradiation intensity. Therefore, the n wall 140 can be formed by curing with a greater UV irradiation energy than curing for forming the network 150. Also, the network 150 can be formed by curing with a smaller UV irradiation energy than curing for forming the wall 140.

Herein, the network 150 also includes the first polymer 141 and the second polymer 142 respectively polymerized from the first and second monomers 141m and 142m by curing in the same manner as the wall 140. To be specific, the first and second monomers 141m and 142m remaining after the curing process for forming the wall 140 are cured at random positions in the entire region during the curing process for forming a network, so that the network 150 is formed.

Figure 11A:
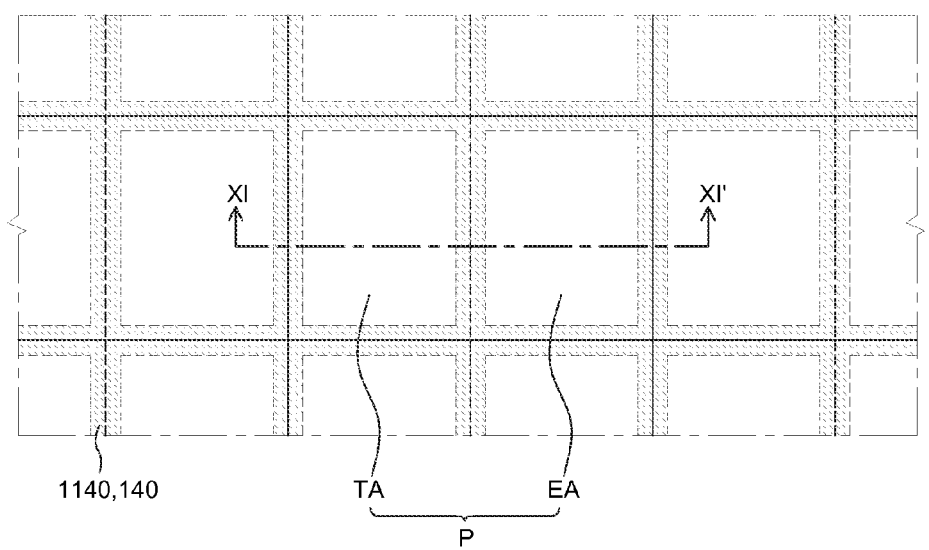
FIG. 11a is a schematic plan view provided for describing a display device to which a light controlling apparatus is applied according to an exemplary embodiment of the present invention.
Figure 11B:
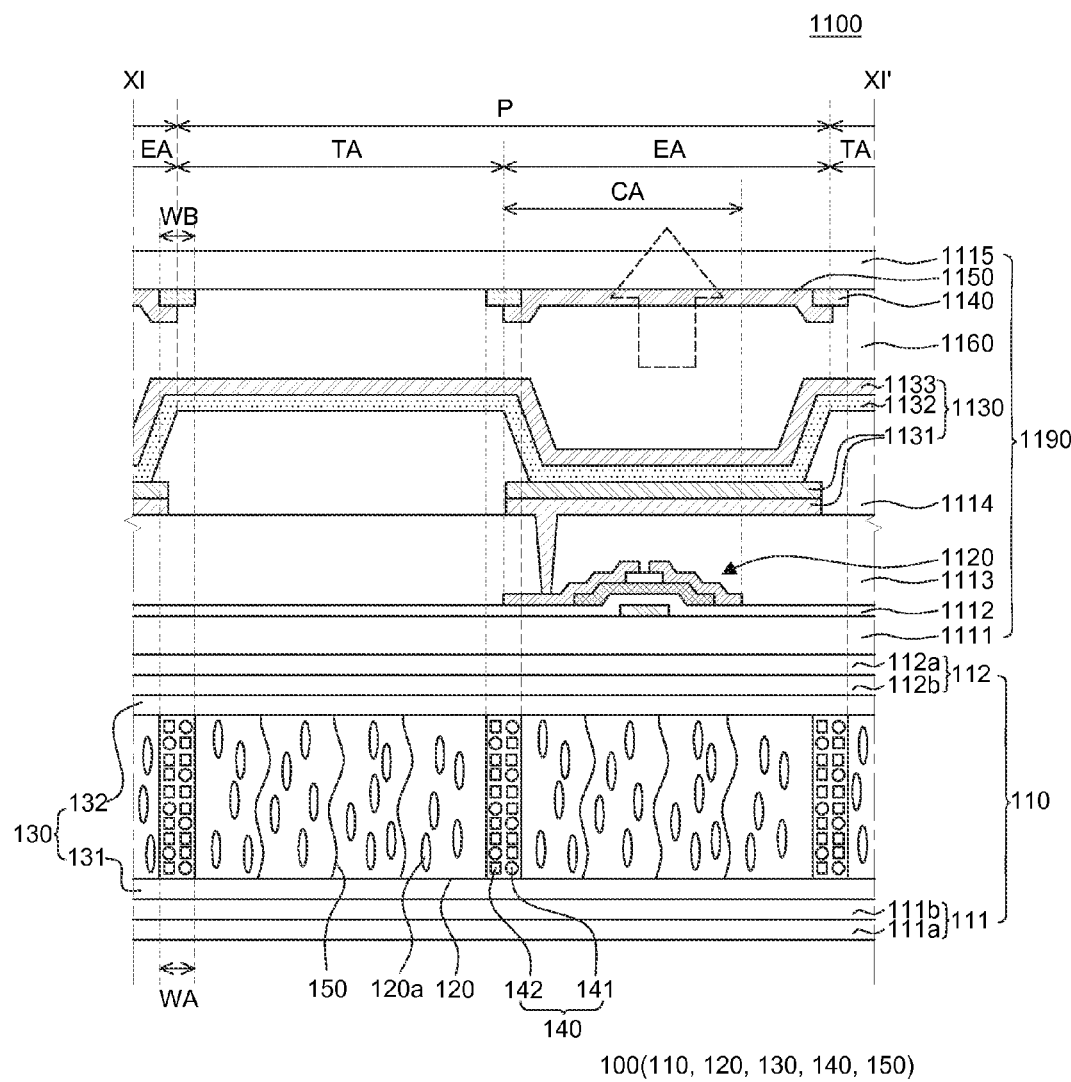

FIG. 11a is a schematic plan view provided for describing a display device to which a light controlling apparatus is applied according to an exemplary embodiment of the present invention. FIG. 11b is a cross-sectional view of the display device taken along a line XI-XI' of FIG. 11a. Referring to FIG. 11a and FIG. 11b, a display device 1100 includes a display panel 1190 and the light controlling apparatus 100. FIG. 11a illustrates only some of a plurality of pixels P of the display device 1100 and illustrates only a black matrix 1140 and the wall 140 of the display device 1100 for convenience in description.

The display panel 1190 is a panel for displaying an image, and may be, for example, an organic light emitting display panel. To be specific, the display panel 1190 may be a transparent organic light emitting display panel or transparent flexible organic light emitting display panel including a transmissive area TA as illustrated in FIGS. 11a and 11b. However, the display panel 1190 is not limited thereto and may display an image in various ways.

Referring to FIG. 11b, the display panel 1190 is a top-emission organic light emitting display panel in which a light emitted from an organic light emitting element 1130 emits toward an upper substrate 1115. Further, the display panel 1190 is a transparent organic light emitting display panel including a transmissive area TA.

Referring to FIG. 11a and FIG. 11b, the display panel 1190 includes a plurality of pixels P, and each pixel P includes a transmissive area TA, an emissive area EA, and a circuit area CA. The transmissive area TA refers to an area where an external light incident from the outside of the display panel 1190 is transmitted. A user can see a background, i.e., a background of the display device 1100, through the transmissive area TA. The emissive area EA refers to an area where a light emitted from the organic light emitting element 1130 emits and also refers to an area where an image is displayed by the organic light emitting element 1130. The circuit area CA refers to an area where various circuits for driving the organic light emitting element 1130 are disposed, and may overlap with the emissive area EA.

Referring to FIG. 11b, a thin-film transistor 1120 is disposed on a lower substrate 1111 of the display panel 1190. To be specific, the thin-film transistor 1120 is disposed in the circuit area CA, and includes a gate electrode, an active layer, a source electrode, and a drain electrode. Further, a gate insulating layer 1112 configured to insulate the gate electrode from the active layer is disposed. A planarization layer 1113 configured to planarize an upper part of the thin-film transistor 1120 is disposed on the thin-film transistor 1120, and the organic light emitting element 1130 is disposed on the planarization layer 1113. The organic light emitting element 1130 is disposed in the emissive area EA, and includes an anode 1131 for supplying a hole to an organic light emitting layer 1132, the organic light emitting layer 1132, and a cathode 1133 for supplying an electron to the organic light emitting layer 1132. The anode 1131 is electrically connected with the thin-film transistor 1120 through a contact hole in the planarization layer 1113. As described above, since the display panel 1190 is a top-emission organic light emitting display panel, the anode 1131 includes, for example, at least a transparent conductive layer formed of transparent conductive oxide (TCO) and a reflective layer disposed under the transparent conductive layer and configured to reflect a light emitted from the organic light emitting element 1130 to an upper part of the display panel 1190. However, the anode 1131 may be defined as including the transparent conductive layer only, and the reflective layer may be defined as a component separate from the anode 1131. A bank 1114 that defines the emissive area EA is disposed on the anode 1131, and the organic light emitting layer 1132 and the cathode 1133 are disposed on the anode 1131 and the bank 1114. The organic light emitting layer 1132 can emit a light of a specific color, for example, a light of any one color of white, red, green, and blue. In the following description, it is described that the organic light emitting layer 1132 emits a white light. The cathode 1133 is disposed on the organic light emitting layer 1132. As described above, since the display panel 1190 is a top-emission organic light emitting display panel 1190, the cathode 1133 may be formed of a transparent conductive material or a metallic material. If the cathode 1133 is formed of a metallic material, the cathode 1133 is formed to have a very small thickness, allowing light emitted from the organic light emitting layer 1132 to pass through the cathode 1133.

The black matrix 1140 is disposed on the upper substrate 1115 of the display panel 1190. The black matrix 1140 is disposed at a boundary between the pixels P and a boundary between the transmissive area TA and the emissive area EA. Further, a color filter 1150 is disposed in the emissive area EA on the upper substrate 1115 of the display panel 1190.

The color filter 1150 may be one among a red color filter, a green color filter, and a blue color filter, but is not limited thereto, and may be a color filter that transmits a light of another color. The upper substrate 1115 and the lower substrate 1111 are bonded or assembled to each other by an adhesive layer 1160. Although not illustrated in FIG. 11b, the display panel 1190 may further include a sealing layer for protecting the organic light emitting element 1130 against moisture or oxygen from the outside.

The light controlling apparatus 100 may be combined with the display panel 1190. Therefore, the light controlling apparatus 100 can provide a light shielding mode and a transparent mode to the user. To be more specific, the light controlling apparatus 100 may be bonded to a rear surface of the display panel 1190 that is opposite from a front surface of the display panel 1190 which is a light emitting surface of the display panel 1190. Herein, although not illustrated in FIG. 11b, if an adhesive member, for example, an optical clear adhesive (OCA) as one among optical transparent adhesives is used to bond or assemble the light controlling apparatus 100 to the rear surface of the transparent display panel 1190 and a lamination process is performed thereto. The light controlling apparatus 100 can be finally combined with the display panel 1190. Further, the OCA may have a refractive index ranging from 1.4 to 1.9.

The wall 140 of the light controlling apparatus 100 is disposed so as to correspond to the black matrix 1140 of the display panel 1190. That is, as illustrated in FIG. 11a and FIG. 11b, the wall 140 of the light controlling apparatus 100 is disposed to overlap with the black matrix 1140 of the display panel 1190 and disposed at all of the boundary between the pixels P of the display panel 1190 and the boundary between the transmissive area TA and the emissive area EA. Herein, a width WA of the wall 140 may be equal to or smaller than a width WB of the black matrix 1140. If the wall 140 of the light controlling apparatus 100 is disposed as described above, the wall 140 may be disposed in a mesh structure in a plan view as illustrated in FIG. 11a. Otherwise, although not illustrated, the wall 140 may be disposed in a stripe structure so as to overlap with a part of the black matrix 1140.

The wall 140 of the light controlling apparatus 100 as described above may be manufactured by the same method as described with reference to FIG. 10d. That is, the wall 140 may be formed by irradiating UV rays with the mask M having the pattern PT corresponding to the black matrix 1140 of the display panel 1190 in order to form the wall 140 at a position corresponding to the black matrix 1140 of the display panel 1190.

Hereinafter, driving methods of a transparent mode and a light shielding mode of the light controlling apparatus 100 will be described with reference to the display device 1100 that supplies an image.

While the display panel 1190 does not supply an image, the light controlling apparatus 100 exhibits a transparent mode. As described above, since the state of the liquid crystal 120a in the liquid crystal unit 120 of the light controlling apparatus 100 is in a homeotropic state as an initial state, while a voltage is not applied to the light controlling apparatus 100, the light controlling apparatus 100 exhibits a transparent mode in which a light incident from the outside is transmitted.

Further, while the display panel 1190 supplies an image, the light controlling apparatus 100 exhibits so as to shield a light incident form the rear surface that is opposite surface of the front surface which is a light emitting surface of the display panel 1190. To be specific, while the display panel 1190 supplies an image, a voltage is applied to the first electrode unit 111 and the second electrode unit 112 of the light controlling apparatus 100 such that there is a voltage difference between the first electrode unit 111 and the second electrode unit 120, and, thus, the liquid crystal 120a in the liquid crystal unit 120 is aligned randomly. Therefore, the liquid crystal unit 120 scatters light incident from the outside, and the light controlling apparatus 100 blocks the light incident from the outside from being seen through the rear surface of the display panel 1190. Thus, the quality of an image can be improved.

Furthermore, the light controlling apparatus 100 may provide an aesthetic effect to the user, if necessary, in addition to the shielding function. For example, if the coloring member 270 as illustrated in FIG. 3 is applied to the light controlling apparatus 100, background image having a color is provided to the user by showing the color of the coloring member 270.

Although FIG. 11b illustrates that the wall 140 of the light controlling apparatus 100 is disposed at all of the boundary between the pixels P of the display panel 1190 and the boundary between the transmissive area TA and the emissive area EA, the wall 140 may be disposed so as to overlap with only the black matrix 1140 disposed at the boundary between the pixels P of the display panel 1190.

Further, since the emissive area EA of the display panel 1190 is an area for emitting a light but not an area capable of transmitting an external light, a portion of the light controlling apparatus 100 corresponding to the emissive area EA may not be realized in a light shielding mode and a transparent mode. That is, the portion of the light controlling apparatus 100 corresponding to the emissive area EA may be continuously in a transparent mode. In this regard, although FIG. 11b illustrates that the electrode 111b of the first electrode unit 111 and the electrode 112b of the second electrode unit 112 are disposed so as to correspond to all of the emissive area EA and the transmissive area TA, the electrode 111b of the first electrode unit 111 and the electrode 112b of the second electrode unit 112 may be disposed only in the transmissive area TA.

Although FIG. 11b illustrates that the light controlling apparatus 100 illustrated in FIG. 1 and FIG. 2 is used as the light controlling apparatus 100, the light controlling apparatus 100 is not limited thereto. The light controlling apparatuses 100, 200, 300, 400, 500, 600 and 700 illustrated in FIG. 3 to FIG. 9 may be used as being combined with the display panel 1190. Further, although FIG. 11b illustrates that the first electrode unit 111 of the light controlling apparatus 100 is in contact with the lower substrate 1111 of the display panel 1190, the second electrode unit 112 of the light controlling apparatus 100 may be in contact with the lower substrate 1111 of the display panel 1190.

Furthermore, the lower substrate 1111 of the display panel 1190 may be one among substrates constituting the first electrode unit 111 or the second electrode unit 112 of the light controlling apparatus 100. For example, if the electrode 111b of the first electrode unit 111 or the electrode 112b of the second electrode unit 112 constituting the light controlling apparatus 100 is formed on a rear surface of the lower substrate 1111 of the display panel 1190, the lower substrate 1111 of the display panel 1190 plays the same role as the substrates 111a and 112a constituting the first electrode unit 111 or the second electrode unit 120. Therefore, the lower substrate 1111, the electrode 111b of the first electrode unit 110, or the electrode 112b of the second electrode unit 112 may have the same configuration as the first electrode unit 111 or second electrode unit 112 as described above.

Figure 11C:
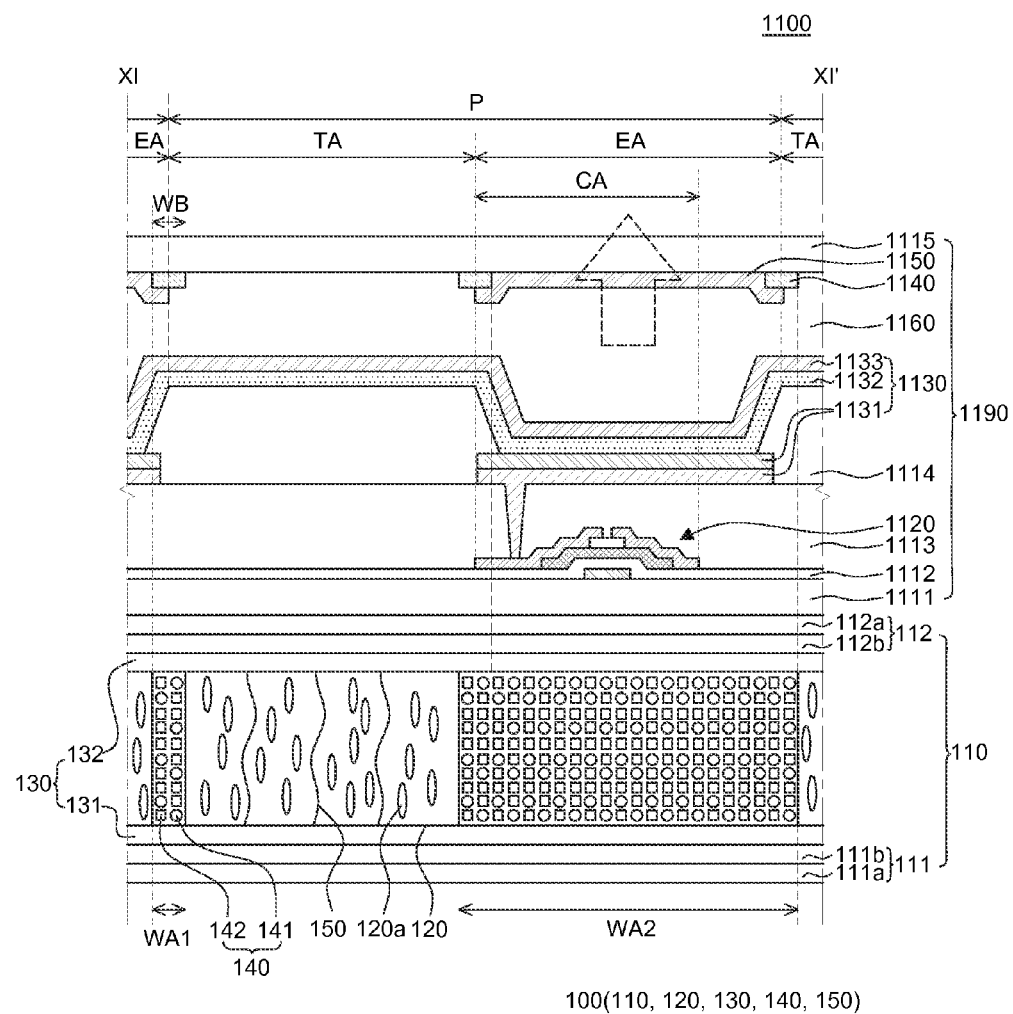
FIG. 11c and FIG. 11d are cross-sectional views of display devices according to various exemplary embodiments of the present invention.

FIG. 11c is a cross-sectional view of a display device according to another exemplary embodiment of the present invention. In the present exemplary embodiment, descriptions on components identical or corresponding to those of the above-described exemplary embodiment will be omitted. Hereinafter, a display device according to the present exemplary embodiment will be described with reference to FIG. 11c.

Referring to FIG. 11c, the wall 140 of the light controlling apparatus 100 may be disposed so as to overlap with the black matrix 1140 of the display panel 1190 and may also be disposed in the emissive area EA of the display panel 1190. Herein, a width WA1 of the wall 140 overlapping with the black matrix 1140 only is equal to the width WB of the black matrix 1140 and smaller than a width WA2 of the wall 140 overlapping with the black matrix 1140 and the emissive area EA. Since the emissive area EA of the display penal 1190 is an area for emitting a light but not an area capable of transmitting an external light, the liquid crystal 120a for shielding or transmitting an external light may not be disposed in a portion of the light controlling apparatus 100 corresponding to the emissive area EA. Therefore, as illustrated in FIG. 11c, the wall 140 of the light controlling apparatus 100 may be formed so as to correspond to the entire emissive area EA.

The wall 140 of the light controlling apparatus 100 may be manufactured by the same method as described with reference to FIG. 10d. That is, the wall 140 may be formed by irradiating UV rays with the mask M having the pattern PT at a position corresponding to the black matrix 1140 of the display panel 1190 and at a position corresponding to the emissive area EA.

A driving method of the light controlling apparatus 100 combined with the display panel 1190 is the same as described above with reference to FIG. 11b, and, thus, redundant descriptions thereof will be omitted.

Although FIG. 11c illustrates that the wall 140 is formed so as to correspond to the entire emissive area EA, the wall 140 may be formed so as to correspond to only a partial area of the emissive area EA.

Figure 11D:
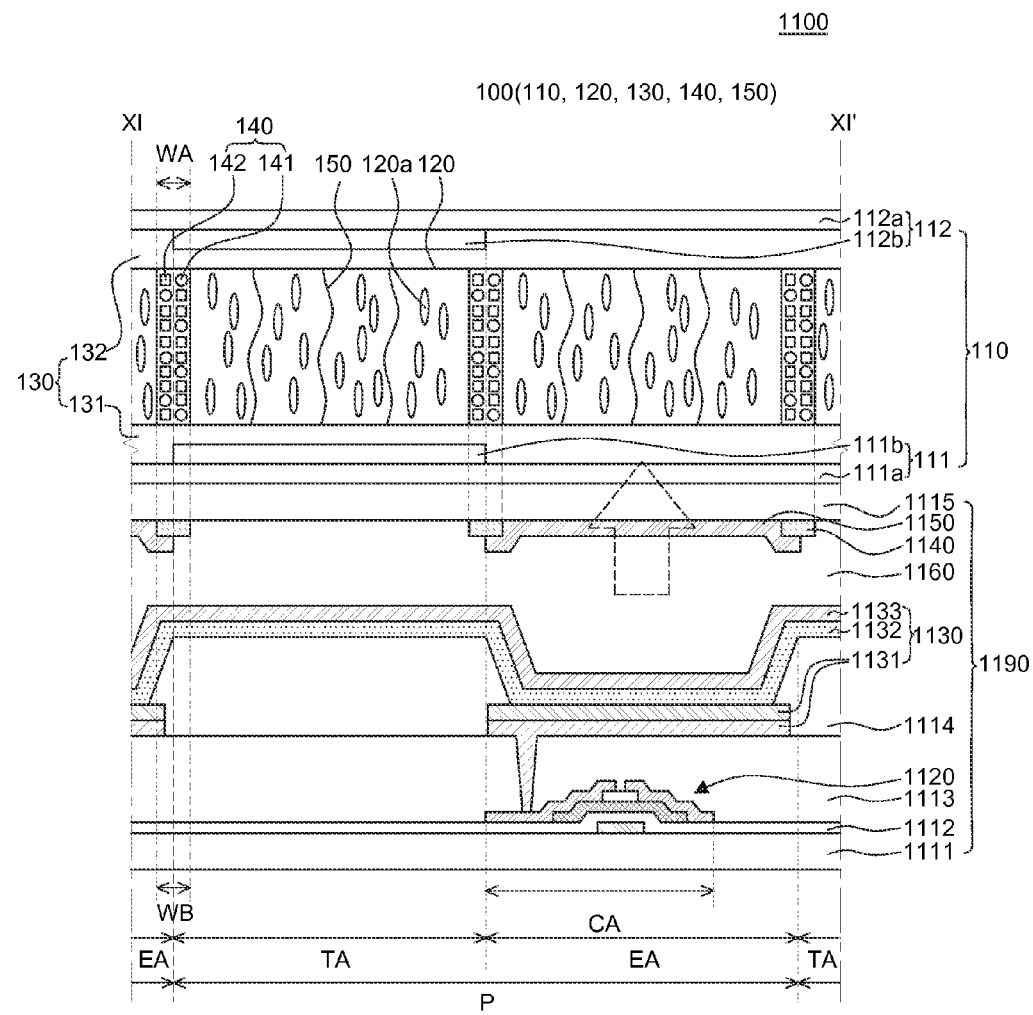

FIG. 11d is a cross-sectional view of a display device according to another exemplary embodiment of the present invention. In the present exemplary embodiment, descriptions on components identical or corresponding to those of the above-described exemplary embodiment will be omitted. Hereinafter, a display device according to the present exemplary embodiment will be described with reference to FIG. 11d.

Referring to FIG. 11d, the light controlling apparatus 100 may be bonded to the front surface as a light emitting surface of the display panel 1190. In this case, although not illustrated in FIG. 11d, if an adhesive member, for example, OCA as one among optical transparent adhesives, is used to bond the light controlling apparatus 100 to the rear surface of the transparent display panel 1190 and a lamination process is performed thereto. The light controlling apparatus 100 can finally be combined with the display panel 1190.

The wall 140 of the light controlling apparatus 100 is disposed so as to correspond to the black matrix 1140 of the display panel 1190. That is, as illustrated in FIG. 11d, the wall 140 of the light controlling apparatus 100 is disposed to overlap with the black matrix 1140 of the display panel 1190 so as to be disposed at all of the boundary between the pixels P of the display panel 1190 and the boundary between the transmissive area TA and the emissive area EA. Herein, the width WA of the wall 140 may be equal to or smaller than the width WB of the black matrix 1140. If the wall 140 of the light controlling apparatus 100 is disposed as described above, the wall 140 may be disposed in a mesh structure in a plan view. Otherwise, although not illustrated, the wall 140 may be disposed in a stripe structure so as to overlap with a part of the black matrix 1140.

The wall 140 of the light controlling apparatus 100 as described above may be manufactured by the same method as described with reference to FIG. 10*d*. That is, the wall 140 may be formed by irradiating UV rays with the mask M having the pattern PT corresponding to the black matrix 1140 of the display panel 1190 in order to form the wall 140 at a position corresponding to the black matrix 1140 of the display panel 1190.

Since the light controlling apparatus 100 is disposed on the front surface of the display panel 1190, the electrode 111*b* of the first electrode unit 111 and the electrode 112*b* of the second electrode unit 112 are formed so as to correspond to the transmissive area TA only. During a manufacturing process of the light controlling apparatus 100, the liquid crystal 120*a* and the coloring member 140 are disposed on the entire region of the light controlling apparatus 100. That is, as illustrated in FIG. 10*c* to FIG. 10*f*, the light controlling apparatus 100 is manufactured by curing the wall 140 and the network 170 in a state where the mixed liquid crystal 120*m* is disposed on the entire region of the light controlling apparatus 100. Thus, it may be difficult not to dispose the liquid crystal 120*a* and the coloring member 140 in a portion of the light controlling apparatus 100 corresponding to the emissive area EA to leave the corresponding space empty during a process.

Therefore, if the electrode 111*b* and the electrode 112*b* are disposed in the emissive area EA, the light controlling apparatus 100 may also be driven in the emissive area EA. Accordingly, a light emitted from the emissive area EA may be blocked by the light controlling apparatus 100. Thus, as illustrated in FIG. 11*d*, the electrode 111*b* and the electrode 112*b* are disposed so as to correspond to the transmissive area TA only, so that only a portion of the light controlling apparatus 100 corresponding to the transmissive area TA is driven and a portion of the light controlling apparatus 100 corresponding to the emissive area EA is continuously maintained in a transparent mode.

Hereinafter, driving methods of a transparent mode and a light shielding mode of the light controlling apparatus 100 will be described with reference to the display device 1100 that supplies an image.

While the display panel 1190 does not supply an image, the light controlling apparatus 100 exhibits a transparent mode. That is, while a voltage is not applied to the light controlling apparatus 100, the light controlling apparatus 100 is realized in a transparent mode in which a light incident from the outside is transmitted.

While the display panel 1190 supplies an image, the light controlling apparatus 100 is realized so as to block a light incident form the rear surface. To be specific, while the display panel 1190 supplies an image, a voltage is applied to the first electrode unit 111 and the second electrode unit 112 of the light controlling apparatus 100, and, thus, the liquid crystal 120*a* in the liquid crystal unit 120 is aligned randomly. Therefore, the liquid crystal unit 120 scatters light incident from the outside, and the light controlling apparatus 100 blocks the light incident from the outside from being seen through the transmissive area TA. Thus, the quality of an image can be improved. In this case, since the electrode 111*b* and the electrode 112*b* are not formed in the portion of the light controlling apparatus 100 corresponding to the emissive area EA, the light controlling apparatus 100 is still realized in a transparent mode, and, thus, the user can see an image through the emissive area EA.

Although FIG. 11*d* illustrates that the wall 140 of the light controlling apparatus 100 is disposed at all of the boundary between the pixels P of the display panel 1190 and the boundary between the transmissive area TA and the emissive area EA, the wall 140 may be disposed so as to overlap with only the black matrix 1140 disposed at the boundary between the pixels P of the display panel 1190.

Further, the upper substrate 1115 of the display panel 1190 may be one among substrates constituting the first electrode unit 111 or the second electrode unit 112 of the light controlling apparatus 100. For example, if the electrode 111*b* of the first electrode unit 111 or the electrode 112*b* of the second electrode unit 112 constituting the light controlling apparatus 100 is formed on a front surface of the upper substrate 1115 of the display panel 1190, the upper substrate 1115 of the display panel 1190 plays the same role as the substrates 111*a* and 112*a* constituting the first electrode unit 111 or the second electrode unit 120. Therefore, the upper substrate 1115, the electrode 111*b* of the first electrode unit 110, or the electrode 112*b* of the second electrode unit 112 may have the same configuration as the first electrode unit 111 or second electrode unit 112 as described above.

Furthermore, when the light controlling apparatus 100 is bonded to the front surface as a light emitting surface of the display panel 1190, the wall 140 may also be formed in the emissive area EA. That is, as illustrated in FIG. 11*c*, a part of the partition wall 140 may overlap with the black matrix 1140 only and another part thereof may overlap with the black matrix 1140 and the emissive area EA. As described above, since the wall 140 is formed of a UV curing monomer formed of a transparent material capable of transmitting a light, the wall 140 may be formed so as to correspond to the entire emissive area EA in order for the portion of the light controlling apparatus 100 corresponding to the emissive area EA to continuously transmit light.

Although FIG. 11*a* to FIG. 11*d* illustrate that the display panel 1100 is an organic light emitting display panel of a top-emission type or a bottom-emission type, the display panel 1100 may be a dual-emission organic light emitting display panel. That is, the display panel 1100 may display an image through a front surface and a rear surface of the display panel. In this case, the light controlling apparatus 100 may be disposed only on one among the front surface and the rear surface of the display panel 1100 or may be disposed on both of the front surface and the rear surface of the display panel 1100. That is, at least one light controlling apparatus 100 may be attached to the display panel 1100.

Figure 12A:
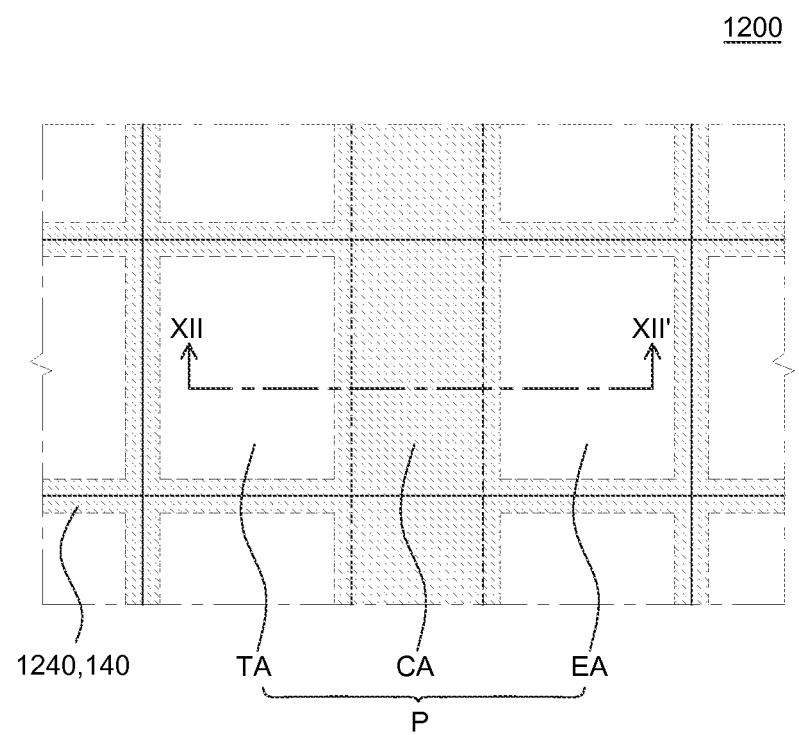
FIG. 12a is a schematic plan view provided for describing a display device to which a light controlling apparatus is applied according to an exemplary embodiment of the present invention.
Figure 12B:
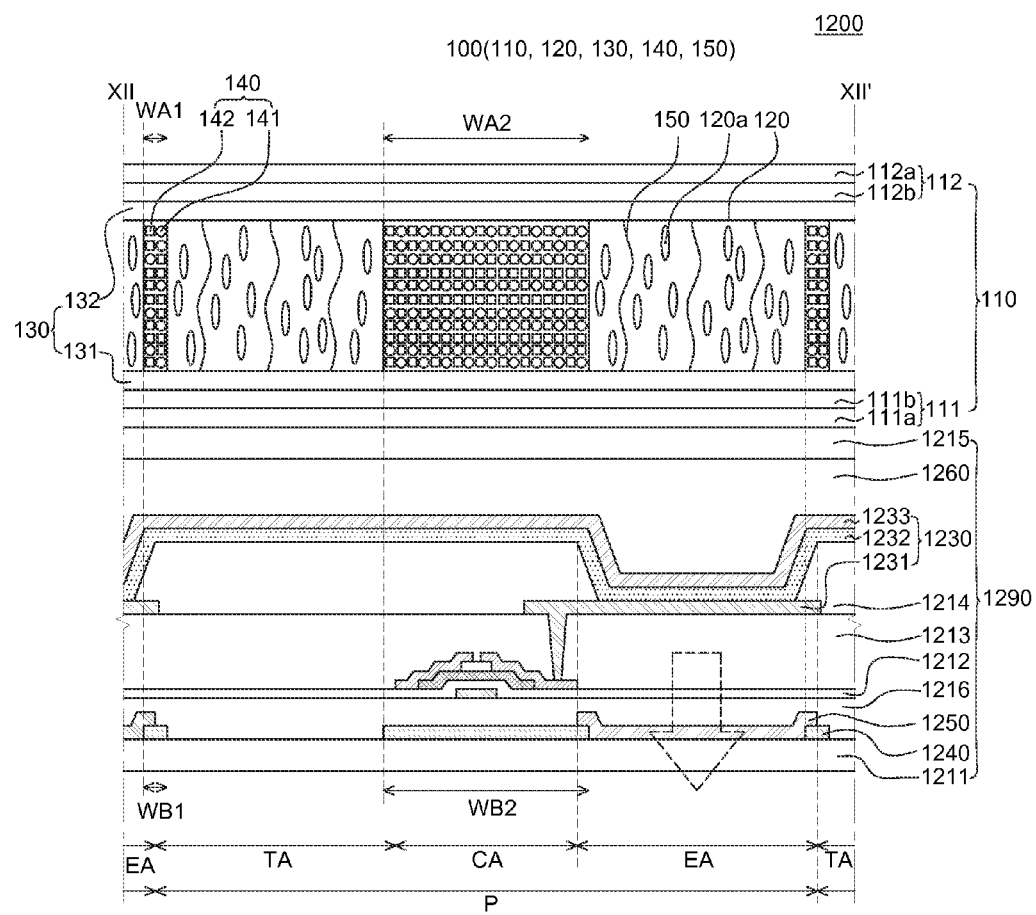

FIG. 12*a* is a schematic plan view provided for describing a display device to which a light controlling apparatus is applied according to an exemplary embodiment of the present invention. FIG. 12*b* is a cross-sectional view of the display device taken along a line XII-XII' of FIG. 12*a*. Referring to FIG. 12*a* and FIG. 12*b*, a display device 1200 includes a display panel 1290 and the light controlling apparatus 100. FIG. 12*a* illustrates only some of a plurality of pixels P of the display device 1200 and illustrates only a black matrix 1240 and the wall 140 of the display device 1200 for convenience in description. In the present exemplary embodiment, descriptions on components identical or corresponding to those of the above-described exemplary embodiment will be omitted. Hereinafter, the display device 1200 according to the present exemplary embodiment will be described with reference to FIG. 12*a*.

Referring to FIG. 12*b*, the display panel 1290 may be a bottom-emission organic light emitting display panel in which light emitted from an organic light emitting element 1230 is released toward a lower substrate 1211. Further, the display panel 1290 is a transparent organic light emitting display panel including a transmissive area TA.

Referring to FIG. 12a and FIG. 12b, the display panel 1290 includes a plurality of pixels P, and each pixel P includes a transmissive area TA, an emissive area EA, and a circuit area CA. As compared with the display device 1100 described above with reference to FIG. 11a and FIG. 11b, the display panel 1290 illustrated in FIG. 12a and FIG. 12b is a bottom-emission organic light emitting display panel, and, thus, the emissive area EA does not overlap with the circuit area CA. That is, since light emitted from the emissive area EA needs to pass through the lower substrate 1211 so as to be released to the outside, the circuit area CA in which various circuits are disposed does not overlap with the emissive area EA.

Referring to FIG. 12b, a thin-film transistor 1220 is disposed on the lower substrate 1211 of the display panel 1290. To be specific, the thin-film transistor 1220 is disposed in the circuit area CA. Further, a gate insulating layer 1212 configured to insulate a gate electrode from an active layer is provided. A planarization layer 1213 configured to planarize an upper part of the thin-film transistor 1220 is disposed on the thin-film transistor 1220, and the organic light emitting element 1230 is disposed on the planarization layer 1213. The organic light emitting element 1230 is disposed in the emissive area EA, and includes an anode 1231 for supplying a hole to an organic light emitting layer 1232, the organic light emitting layer 1232, and a cathode 1233 for supplying an electron to the organic light emitting layer 1232. The anode 1231 is electrically connected with the thin-film transistor 1220 through a contact hole in the planarization layer 1213. As described above, since the display panel 1290 is a bottom-emission organic light emitting display panel, the anode 1231 includes a transparent conductive layer formed of transparent conductive oxide (TCO). A bank 1214 that defines the emissive area EA is disposed on the anode 1231, and the organic light emitting layer 1232 and the cathode 1233 are disposed on the anode 1231 and the bank 1214. The organic light emitting layer 1232 can emit light of a specific color, for example, light of any one color of white, red, green, and blue. In the following description, it is described that the organic light emitting layer 1232 emits a white light. The cathode 1233 is disposed on the organic light emitting layer 1232. As described above, since the display panel 1290 is a bottom-emission organic light emitting display panel, the cathode 1233 may be formed of a metallic material. The upper substrate 1215 and the lower substrate 1211 are bonded to each other by an adhesive layer 1260. Although not illustrated in FIG. 12b, the display panel 1290 may further include a sealing layer for protecting the organic light emitting element 1230 against moisture or oxygen from the outside.

The black matrix 1240 is disposed on the lower substrate 1211 of the display panel 1290. The black matrix 1240 is disposed at a boundary between the pixels P, a boundary between the emissive area EA and the circuit area CA, a boundary between the transmissive area TA and the circuit area CA, and in the circuit area CA. Further, a color filter 1250 is disposed in the emissive area EA on the lower substrate 1211 of the display panel 1290. The color filter 1250 may be one among a red color filter, a green color filter, and a blue color filter, but is not limited thereto, and may be a color filter that transmits light of another color. An overcoat layer 1216 for planarizing an upper part of the color filter 1250 is disposed on the color filter 1250, and the thin-film transistor 1220 is disposed on the overcoat layer 1216.

The light controlling apparatus 100 may have a function of a light shielding plate by being combined with the display panel 1290. To be specific, referring to FIG. 12b, the light controlling apparatus 100 may be bonded to a front surface of the display panel 1290 that is opposite of a rear surface of the display panel 1290 which is a light emitting surface of the display panel 1290. Herein, although not illustrated in FIG. 12b, if an adhesive member, for example, OCA as one among optical transparent adhesives, is used to bond the light controlling apparatus 100 to the rear→front surface of the transparent display panel 1290 and a lamination process is performed thereto. The light controlling apparatus 100 can be finally combined with the display panel 1290.

The wall 140 of the light controlling apparatus 100 is disposed so as to correspond to the black matrix 1240 of the display panel 1290. That is, as illustrated in FIG. 12b, the wall 140 of the light controlling apparatus 100 is disposed at the boundary between the pixels P, the boundary between the emissive area EA and the circuit area CA, the boundary between the transmissive area TA and the circuit area CA, and in the circuit area CA. Herein, the width WA1 of the wall 140 disposed at the boundary between the pixels P may be equal to or smaller than a width WB1 of the black matrix 1240 disposed at the boundary between the pixels P. The width of the wall 140 disposed in the circuit area CA may be equal to or smaller than a width WB2 of the black matrix 1240 disposed in the circuit area CA. If the wall 140 of the light controlling apparatus 100 is disposed as described above, the wall 140 may be disposed in a mesh structure in a plane view as illustrated in FIG. 12a. Otherwise, although not illustrated, the wall 140 may be disposed in a stripe structure so as to overlap with some part of the black matrix 1240.

The wall 140 of the light controlling apparatus 100 as described above may be manufactured by the same method as described with reference to FIG. 10d. That is, the wall 140 may be formed by irradiating UV rays with the mask M having the pattern PT corresponding to the black matrix 1240 of the display panel 1290 in order to form the wall 140 at a position corresponding to the black matrix 1240 of the display panel 1290.

Hereinafter, driving methods of a transparent mode and a light shielding mode of the light controlling apparatus 100 will be described with reference to the display device 1200 that supplies an image.

While the display panel 1290 does not supply an image, the light controlling apparatus 100 exhibits a transparent mode. As described above, since the liquid crystal 120a in the liquid crystal unit 120 of the light controlling apparatus 100 is in a homeotropic state as an initial state, while a voltage is not applied to the light controlling apparatus 100, the light controlling apparatus 100 exhibits a transparent mode in which light incident from the outside is transmitted.

Further, while the display panel 1290 supplies an image, the light controlling apparatus 100 is driven so as to block light incident form the front surface that is opposite of the rear surface which is a light emitting surface of the display panel 1290. To be specific, while the display panel 1290 supplies an image, a voltage is applied to the first electrode unit 111 and the second electrode unit 112 of the light controlling apparatus 100 such that there is a voltage difference between the first electrode unit 111 and the second electrode unit 120, and, thus, the liquid crystal 120a in the liquid crystal unit 120 is aligned randomly. Therefore, the liquid crystal unit 120 scatters light incident from the outside, and the light controlling apparatus 100 blocks the light incident from the outside from being seen through the rear surface of the display panel 1290. Thus, the quality of an image can be improved.

Furthermore, the display panel 1290 may provide an aesthetic effect to the user, if necessary, in addition to the light shielding plate function. For example, the light controlling apparatus 100 may provide wallpaper having a color to the user by showing the color of the coloring member 270 constituting the light controlling apparatus 100.

Although FIG. 12*b* illustrates that the wall 140 of the light controlling apparatus 100 is disposed at all of the boundary between the pixels P, the boundary between the emissive area EA and the circuit area CA, the boundary between the transmissive area TA and the circuit area CA, and in the circuit area CA, the wall 140 may be disposed so as to overlap with only the black matrix 1240 disposed at the boundary between the pixels P of the display panel 1290.

Further, the wall 140 of the light controlling apparatus 100 may also be disposed in the emissive area EA. Since the wall 140 is formed of a UV curing monomer formed of a transparent material capable of transmitting light, the wall 140 may be formed so as to correspond to the entire emissive area EA in order for the portion of the light controlling apparatus 100 corresponding to the emissive area EA to continuously transmit light. In this case, the wall 140 may not be disposed in the circuit area CA.

Also, although FIG. 12*b* illustrates that the electrode 111*b* of the first electrode unit 111 and the electrode 112*b* of the second electrode unit 112 are disposed so as to correspond to all of the emissive area EA and the transmissive area TA, the electrode 111*b* and the electrode 112*b* may be disposed only in the transmissive area TA. That is, since the emissive area EA of the display penal 1290 is an area for emitting light but not an area capable of transmitting an external light, the portion of the light controlling apparatus 100 corresponding to the emissive area EA may not be driven in a light shielding mode and a transparent mode. That is, the portion of the light controlling apparatus 100 corresponding to the emissive area EA may be continuously in a transparent mode. Thus, the electrode 111*b* and the electrode 112*b* may be disposed only in the transmissive area TA.

Although FIG. 12*b* illustrates that the light controlling apparatus 100 illustrated in FIG. 1 and FIG. 2 is used as the light controlling apparatus 100, the light controlling apparatus 100 is not limited thereto. The light controlling apparatuses 100, 200, 300, 400, 500, 600 and 700 illustrated in FIG. 3 to FIG. 9 may be used by being combined with the display panel 1290. Further, although FIG. 12*b* illustrates that the first electrode unit 111 of the light controlling apparatus 100 is in contact with the upper substrate 1215 of the display panel 1290, the second electrode unit 112 of the light controlling apparatus 100 may be in contact with the upper substrate 1215 of the display panel 1290.

Furthermore, the upper substrate 1215 of the display panel 1290 may be one among substrates constituting the first electrode unit 111 or the second electrode unit 112 of the light controlling apparatus 100. For example, if the electrode 111*b* of the first electrode unit 111 or the electrode 112*b* of the second electrode unit 112 constituting the light controlling apparatus 100 is formed on a front surface of the upper substrate 1215 of the display panel 1290, the upper substrate 1215 of the display panel 1290 plays the same role as the substrates 111*a* and 112*a* constituting the first electrode unit 111 or the second electrode unit 120. Therefore, the upper substrate 1215, the electrode 111*b* of the first electrode unit 110, or the electrode 112*b* of the second electrode unit 112 may have the same configuration as the first electrode unit 111 or second electrode unit 112 as described above.

Although FIG. 12*a* and FIG. 12*b* illustrate that the transmissive area TA, the circuit area CA, and the emissive area EA are disposed in sequence in one pixel P, the sequence of the transmissive area TA, the circuit area CA, and the emissive area EA in one pixel P is not limited thereto.

Figure 12C:
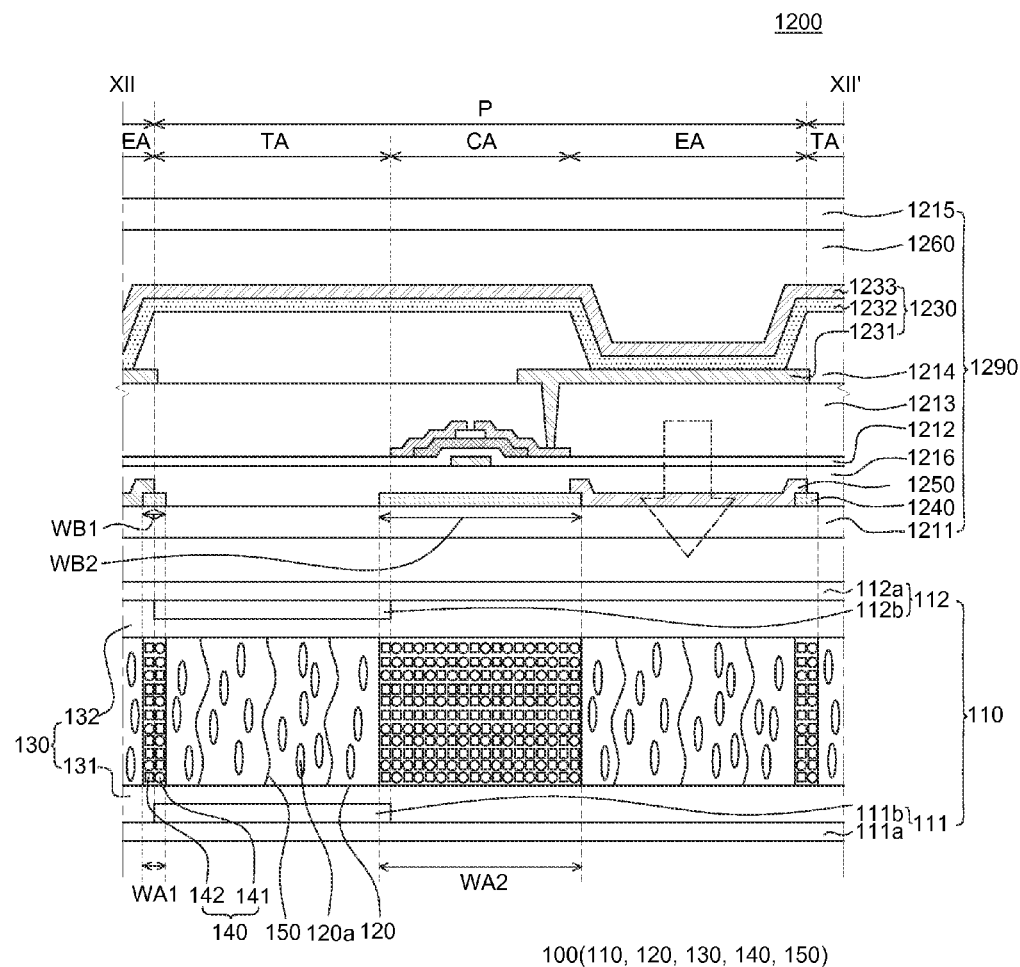
FIG. 12c is a cross-sectional view of a display device according to another exemplary embodiment of the present invention.

FIG. 12*c* is a cross-sectional view of a display device according to another exemplary embodiment of the present invention. In the present exemplary embodiment, descriptions on components identical or corresponding to those of the above-described exemplary embodiment will be omitted. Hereinafter, a display device according to the present exemplary embodiment will be described with reference to FIG. 12*c*.

Referring to FIG. 12*c*, the light controlling apparatus 100 may be bonded to the rear surface of the display panel 1290 where the display panel 1290 outputs an image. In this case, although not illustrated in FIG. 12*c*, if an adhesive member, for example, OCA as one among optical transparent adhesives, is used to bond or assemble the light controlling apparatus 100 to the front surface of the transparent display panel 1290 and a lamination process is performed thereto. The light controlling apparatus 100 can be finally combined with the display panel 1290.

The wall 140 of the light controlling apparatus 100 is disposed so as to correspond to the black matrix 1240 of the display panel 1290. That is, as illustrated in FIG. 12*c*, as the wall 140 of the light controlling apparatus 100 is disposed so as to overlap with the black matrix 1240 of the display panel 1290 the wall 140 of the light controlling apparatus 100 is disposed at all of the boundary between the pixels P of the display panel 1290, the boundary between the emissive area EA and the circuit area CA, the boundary between the transmissive area TA and the circuit area CA, and in the circuit area CA.

The wall 140 of the light controlling apparatus 100 as described above may be manufactured by the same method as described with reference to FIG. 10*d*. That is, the wall 140 may be formed by irradiating UV rays with the mask M having the pattern PT corresponding to the black matrix 1240 of the display panel 1290 in order to form the wall 140 at a position corresponding to the black matrix 1240 of the display panel 1290.

Since the light controlling apparatus 100 is disposed on the rear surface of the display panel 1290, the electrode 111*b* of the first electrode unit 111 and the electrode 112*b* of the second electrode unit 112 are formed so as to correspond to the transmissive area TA only. During a manufacturing process of the light controlling apparatus 100, the liquid crystal 120*a* is disposed on the entire region of the light controlling apparatus 100. That is, as illustrated in FIG. 10*c* to FIG. 10*f*, the light controlling apparatus 100 is manufactured by curing the wall 140 and the network 170 in a state where the mixed liquid crystal 120*m* is disposed on the entire region of the light controlling apparatus 100. Thus, it may be difficult not to dispose the liquid crystal 120*a* in a portion of the light controlling apparatus 100 corresponding to the emissive area EA to leave the corresponding space empty during a process. Therefore, if the electrode 111*b* and the electrode 112*b* are disposed in the emissive area EA, the light controlling apparatus 100 may also be driven in the emissive area EA. Accordingly, light emitted from the emissive area EA may be blocked by the light controlling apparatus 100. Thus, as illustrated in FIG. 12*c*, the electrode 111*b* and the electrode 112*b* are disposed so as to correspond to the transmissive area TA only, so that only a portion of the light controlling apparatus 100 corresponding to the transmissive area TA is driven and a portion of the light controlling apparatus 100 corresponding to the emissive area EA is continuously maintained in a transparent mode.

Hereinafter, driving methods of a transparent mode and a light shielding mode of the light controlling apparatus 100 will be described with reference to the display device 1200 that supplies an image.

While the display panel 1290 does not supply an image, the light controlling apparatus 100 exhibits a transparent mode. That is, while a voltage is not applied to the light controlling apparatus 100, the light controlling apparatus 100 is realized in a transparent mode in which light incident from the outside is transmitted.

While the display panel 1290 supplies an image, the light controlling apparatus 100 is realized so as to block light incident from the rear surface. To be specific, while the display panel 1290 supplies an image, a voltage is applied to the electrode 111*b* and the electrode 112*b* of the first electrode unit 111 of the light controlling apparatus 100, and, thus, the liquid crystal 120*a* in the liquid crystal unit 120 is aligned randomly and the liquid crystal unit 120 scatters light incident from the outside. Therefore, the light controlling apparatus 100 blocks the light incident from the outside from being seen through the transmissive area TA of the display panel 1290. Thus, the quality of an image can be improved. In this case, since the electrode 111*b* and the electrode 112*b* are not formed in the portion of the light controlling apparatus 100 corresponding to the emissive area EA, the light controlling apparatus 100 is still realized in a transparent mode, and, thus, the user can see an image through the emissive area EA.

Although FIG. 12*c* illustrates that the wall 140 of the light controlling apparatus 100 is disposed at all of the boundary between the pixels P, the boundary between the emissive area EA and the circuit area CA, the boundary between the transmissive area TA and the circuit area CA, and in the circuit area CA, the wall 140 may be disposed so as to overlap with only the black matrix 1240 disposed at the boundary between the pixels P of the display panel 1290.

Further, the wall 140 of the light controlling apparatus 100 may also be disposed in the emissive area EA. Since the wall 140 is formed of a UV curing monomer formed of a transparent material capable of transmitting light, the wall 140 may be formed so as to correspond to the entire emissive area EA in order for the portion of the light controlling apparatus 100 corresponding to the emissive area EA to continuously transmit light. In this case, the wall 140 may not be disposed in the circuit area CA.

The lower substrate 1211 of the display panel 1290 may be one among substrates constituting the first electrode unit 111 or the second electrode unit 112 of the light controlling apparatus 100. For example, if the electrode 111*b* of the first electrode unit 111 or the electrode 112*b* of the second electrode unit 112 constituting the light controlling apparatus 100 is formed on a front surface of the lower substrate 1211 of the display panel 1290, the lower substrate 1211 of the display panel 1290 plays the same role as the substrates 111*a* and 112*a* constituting the first electrode unit 111 or the second electrode unit 120. Therefore, the lower substrate 1211, the electrode 111*b* of the first electrode unit 110, or the electrode 112*b* of the second electrode unit 112 may have the same configuration as the first electrode unit 111 or second electrode unit 112 as described above.

Although the present invention has been described above with reference to the specific exemplary embodiments, the exemplary embodiments are provided for illustrative purposes only but not intended to limit the light controlling apparatus and the method of fabricating the same according to the present invention. It is clear that the exemplary embodiments can be modified or improved by a person having ordinary skill in the art within a technical concept of the present invention.

All of simple modifications or changes of the present invention are included in the scope of the present invention, and the protective scope of the present invention will be more clearly understood from the appended claims.

What is claimed is:

1. A light controlling apparatus comprising:
   a first electrode unit and a second electrode unit facing each other, the first electrode unit comprising a first substrate, the second electrode unit comprising a second substrate, and at least one of the electrode units comprising at least one electrode;
   a liquid crystal unit between the first electrode unit and the second electrode unit and the liquid crystal unit including:
   a liquid crystal;
   a network, mixed together with the liquid crystal, having a first polymer polymerized from a first monomer having a similar shape as the liquid crystal to assist in vertical alignment of the liquid crystal when an electric field is not applied and a second polymer polymerized from a second monomer having a shape different from the first monomer to assist in random alignment of the liquid crystal when an electric field is applied; and
   a wall, configured in a mesh structure to correspond with boundaries related to a plurality of pixels P at a display device, formed from the first polymer and the second polymer,
   wherein the light controlling apparatus operates in a transparent mode with the liquid crystal in a homeotropic state and operates in a light shielding mode with the liquid crystal in a random state.

2. The light controlling apparatus according to claim 1, further comprising a spacer on at least one among the first electrode unit and the second electrode unit.

3. The light controlling apparatus according to claim 1, wherein the first monomer and the second monomer are UV-hardened monomers.

4. The light controlling apparatus according to claim 3, wherein UV wavelengths of the UV-hardened monomers include same wavelength range.

5. The light controlling apparatus according to claim 1, wherein the first monomer includes a RM (reactive mesogen)-based monomer.

6. The light controlling apparatus according to claim 1, wherein the second monomer includes a Bisphenol A Dimethacrylate-based monomer.

7. The light controlling apparatus according to claim 1, wherein if the liquid crystal is one among a negative type liquid crystal or a DFLC (dual frequency liquid crystal), each of the first electrode unit and the second electrode unit includes a common electrode.

8. The light controlling apparatus according to claim 7, wherein if the liquid crystal is the negative type liquid crystal, each of the first electrode unit and the second electrode unit is configured to apply a vertical electric field to the liquid crystal unit.

9. The light controlling apparatus according to claim 8, wherein the light controlling apparatus exhibits the transparent mode with the liquid crystal in the homeotropic state when a voltage is not applied, and wherein the light controlling apparatus exhibits the light shielding mode with the liquid crystal in the random state when a voltage is applied.

10. The light controlling apparatus according to claim 1, wherein if the liquid crystal includes one among a positive type liquid crystal or a DFLC (dual frequency liquid crystal), at least one among the first electrode unit and the second electrode unit includes a plurality of patterned electrodes.

11. The light controlling apparatus according to claim 10, wherein a horizontal electric field is applied to the patterned electrodes.

12. The light controlling apparatus according to claim 11, wherein the light controlling apparatus exhibits the transparent mode with the liquid crystal in the homeotropic state when a voltage is not applied, and wherein the light controlling apparatus exhibits the light shielding mode with the liquid crystal in the random state when a voltage is applied.

13. The light controlling apparatus according to claim 1, wherein if the liquid crystal includes one among a positive type liquid crystal or a DFLC, at least one among the first electrode unit and the second electrode unit includes a plurality of patterned electrodes and a common electrode.

14. The light controlling apparatus according to claim 13, wherein a horizontal electric field is applied to the patterned electrode and the common electrode.

15. The light controlling apparatus according to claim 14, wherein the light controlling apparatus exhibits the transparent mode with the liquid crystal in the homeotropic state when a voltage is not applied, and wherein the light controlling apparatus exhibits the light shielding mode with the liquid crystal in the random state when a voltage is applied.

16. The light controlling apparatus according to claim 1, further comprising an alignment unit configured to align the liquid crystal in a homeotropic state.

17. The light controlling apparatus according to claim 16, wherein the alignment unit is on or under the liquid crystal unit.

18. A display device comprising:
a display panel; and
at least one light controlling apparatus according to claim 1 attached to the display panel.

19. The display device according to claim 18, wherein the display panel is an OLED panel.

20. The display device according to claim 18, wherein the light controlling apparatus is attached to the front surface of the display panel.

21. The display device according to claim 18, wherein the light controlling apparatus is attached to the rear surface of the display panel.

22. A mixed liquid crystal in which a liquid crystal, a first monomer and a second monomer are present, wherein the first monomer has a similar shape as the liquid crystal to assist in vertical alignment of the liquid crystal when an electric field is not applied and the second monomer has a shape different from the first monomer to assist in random alignment of the liquid crystal when an electric field is applied, and wherein the mixed liquid crystal having the first monomer and the second monomer is configured to have both a network and a wall in a light controlling apparatus.

23. The mixed liquid crystal according to claim 22, wherein the light controlling apparatus exhibits a transparent mode with the liquid crystal in a homeotropic state when a voltage is not applied, and wherein the light controlling apparatus exhibits a light shielding mode with the liquid crystal in a random state when a voltage is applied.

24. The mixed liquid crystal according to claim 22, wherein UV wavelengths for polymerizing the first monomer are in the same wavelength range as UV wavelengths for polymerizing the second monomer.

25. The mixed liquid crystal according to claim 22, wherein the first monomer includes an RM (reactive mesogen)-based monomer.

26. The mixed liquid crystal according to claim 22, wherein the second monomer includes a Bisphenol A Dimethacrylate-based monomer.

27. The mixed liquid crystal according to claim 22, wherein the first monomer and the second monomer are polymerized by irradiation with UV rays.

28. The mixed liquid crystal according to claim 22, wherein the liquid crystal includes one among a positive liquid crystal, a negative liquid crystal or a DFLC (dual frequency liquid crystal).

* * * * *